(12) United States Patent
Doornbos et al.

(10) Patent No.: US 11,600,616 B2
(45) Date of Patent: Mar. 7, 2023

(54) SEMICONDUCTOR DEVICE INCLUDING FINFETS HAVING DIFFERENT CHANNEL HEIGHTS

(71) Applicant: TAIWAN SEMICONDUCTOR MANUFACTURING CO., LTD., Hsinchu (TW)

(72) Inventors: Gerben Doornbos, Leuven (BE); Mark Van Dal, Linden (BE)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 21 days.

(21) Appl. No.: 16/585,683

(22) Filed: Sep. 27, 2019

(65) Prior Publication Data

US 2020/0043921 A1 Feb. 6, 2020

Related U.S. Application Data

(62) Division of application No. 15/707,682, filed on Sep. 18, 2017, now Pat. No. 10,679,988.

(51) Int. Cl.
*H01L 27/088* (2006.01)
*H01L 21/8238* (2006.01)
(Continued)

(52) U.S. Cl.
CPC .... *H01L 27/0886* (2013.01); *H01L 21/82385* (2013.01); *H01L 21/823431* (2013.01);
(Continued)

(58) Field of Classification Search
CPC ......... H01L 27/0886; H01L 21/823821; H01L 27/0924; H01L 21/823431;
(Continued)

(56) References Cited

U.S. PATENT DOCUMENTS 7,442,596 B2   10/2008  Lee et al.
9,209,247 B2   12/2015  Colinge et al.
(Continued)

FOREIGN PATENT DOCUMENTS

CN   105047564 A   11/2015
CN   106030814 A   10/2016
(Continued)

OTHER PUBLICATIONS

Final Office Action issued in related U.S. Appl. No. 15/707,682, dated Jul. 8, 2019.
(Continued)

*Primary Examiner* — Nelson Garces
(74) *Attorney, Agent, or Firm* — McDermott Will & Emery LLP

(57) ABSTRACT

In a method of manufacturing a semiconductor device, a fin structure protruding from a first isolation insulating layer is formed. A second isolation insulating layer made of different material than the first isolation insulating layer is formed so that a first upper portion of the fin structure is exposed. A dummy gate structure is formed over the exposed first upper portion of the first fin structure. The second isolation insulating layer is etched by using the dummy gate structure as an etching mask. The dummy gate structure is removed so that a gate space is formed. The second isolation insulating layer is etched in the gate space so that a second upper portion of the fin structure is exposed from the first isolation insulating layer. A gate dielectric layer and a gate electrode layer are formed over the exposed second portion of the fin structure.

20 Claims, 34 Drawing Sheets

(51) Int. Cl.
*H01L 27/092* (2006.01)
*H01L 21/8234* (2006.01)
*H01L 29/06* (2006.01)
*H01L 29/66* (2006.01)
*H01L 29/78* (2006.01)

(52) U.S. Cl.
CPC ........ *H01L 21/823456* (2013.01); *H01L 21/823481* (2013.01); *H01L 21/823807* (2013.01); *H01L 21/823821* (2013.01); *H01L 27/0924* (2013.01); *H01L 29/0653* (2013.01); *H01L 29/66545* (2013.01); *H01L 29/66795* (2013.01); *H01L 29/785* (2013.01)

(58) Field of Classification Search
CPC ......... H01L 29/66795; H01L 29/785; H01L 29/66545; H01L 21/82385; H01L 21/823456; H01L 29/7831; H01L 29/6656; H01L 21/823468; H01L 21/823864
See application file for complete search history.

(56) References Cited

U.S. PATENT DOCUMENTS

| | | | |
|---|---|---|---|
| 9,236,267 | B2 | 1/2016 | De et al. |
| 9,412,817 | B2 | 8/2016 | Yang et al. |
| 9,412,828 | B2 | 8/2016 | Ching et al. |
| 9,472,618 | B2 | 10/2016 | Oxland |
| 9,502,265 | B1 | 11/2016 | Jiang et al. |
| 9,520,482 | B1 | 12/2016 | Chang et al. |
| 9,536,738 | B2 | 1/2017 | Huang et al. |
| 9,576,814 | B2 | 2/2017 | Wu et al. |
| 9,608,116 | B2 | 3/2017 | Ching et al. |
| 9,911,833 | B2 | 3/2018 | Zhou |
| 10,163,704 | B2 | 12/2018 | Chen et al. |
| 10,269,927 | B2 | 4/2019 | Zhou |
| 2010/0041198 | A1* | 2/2010 | Zhu ............... H01L 27/1211 438/283 |
| 2014/0239355 | A1* | 8/2014 | Yin ............... H01L 29/1033 257/288 |
| 2014/0353734 | A1* | 12/2014 | Xie ............... H01L 21/76834 257/288 |
| 2015/0091100 | A1 | 4/2015 | Xie et al. |
| 2015/0206956 | A1* | 7/2015 | Kim ............... H01L 21/823431 438/294 |
| 2015/0287743 | A1 | 10/2015 | Kerber et al. |
| 2015/0287809 | A1* | 10/2015 | Kerber ........... H01L 21/845 438/479 |
| 2016/0181384 | A1* | 6/2016 | Liu ............... H01L 29/66772 438/270 |
| 2016/0314965 | A1* | 10/2016 | Nguyen ......... H01L 21/76834 |
| 2016/0365345 | A1* | 12/2016 | Ching ........... H01L 27/1211 |
| 2016/0365426 | A1* | 12/2016 | Ching ........... H01L 29/7851 |
| 2017/0025313 | A1 | 1/2017 | Ching et al. |
| 2017/0110554 | A1 | 4/2017 | Tak et al. |
| 2017/0133486 | A1 | 5/2017 | Zhou |
| 2017/0140924 | A1 | 5/2017 | Suzuki et al. |
| 2017/0141106 | A1 | 5/2017 | Chang et al. |
| 2017/0141220 | A1 | 5/2017 | Ching et al. |
| 2018/0278025 | A1 | 9/2018 | Leobandung et al. |

FOREIGN PATENT DOCUMENTS

| | | |
|---|---|---|
| CN | 106684042 A | 5/2017 |
| CN | 106684144 A | 5/2017 |
| KR | 100578818 B1 | 5/2006 |
| KR | 10-2017-0078514 A | 7/2017 |
| TW | 201732936 A | 9/2017 |
| WO | 2017052604 A1 | 3/2017 |

OTHER PUBLICATIONS

Non-Final Office Action issued in related U.S. Appl. No. 15/707,682, dated Jan. 3, 2019.

* cited by examiner

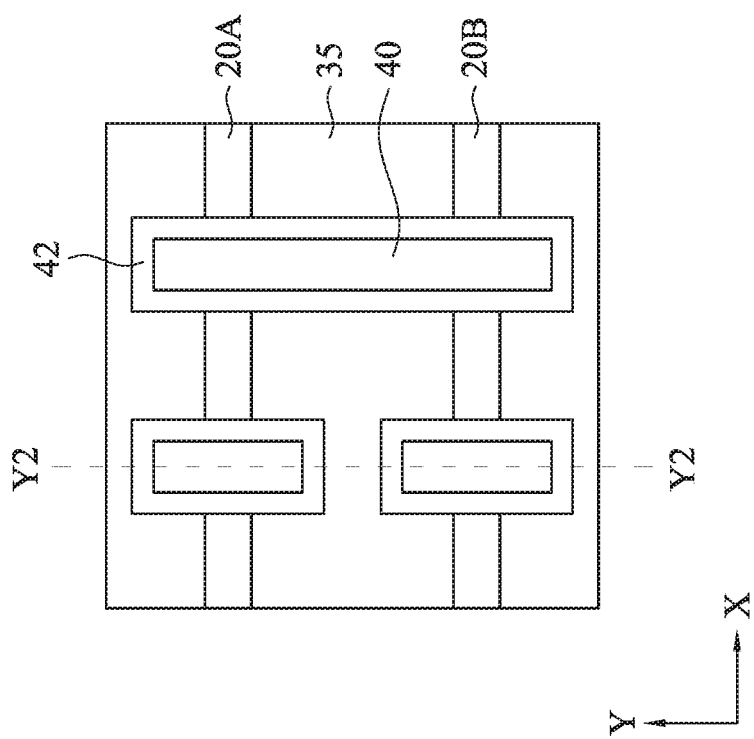
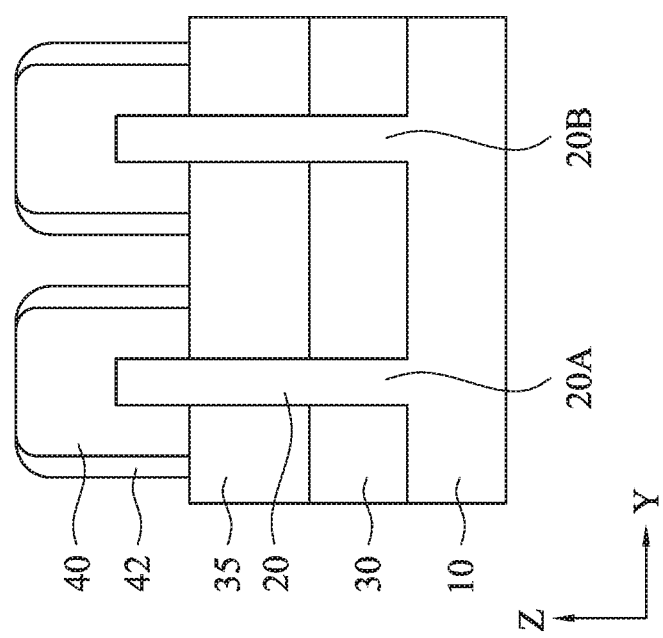
FIG. 7A
FIG. 7B

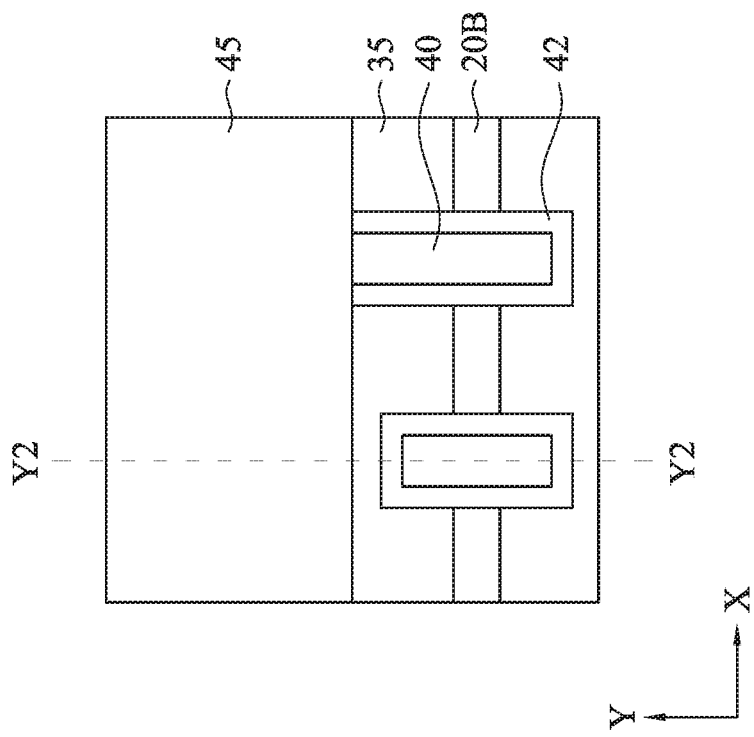
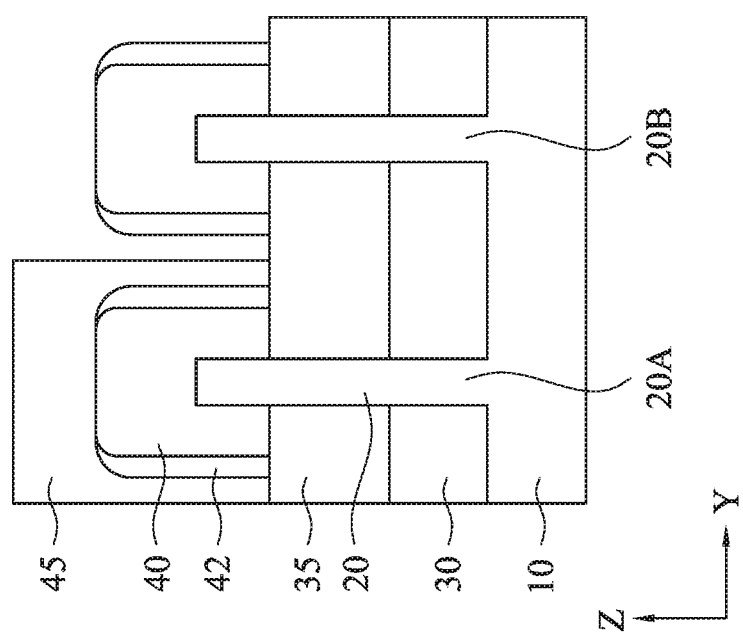

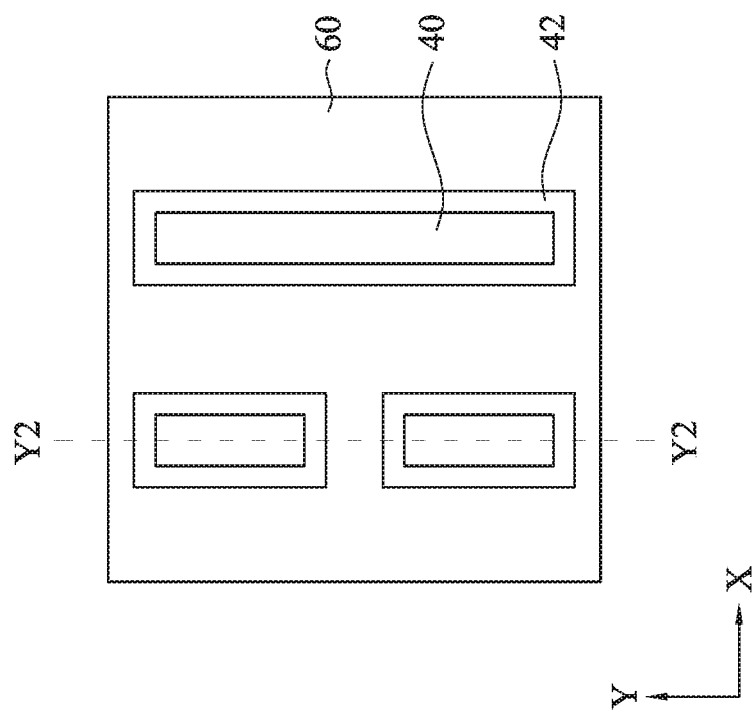
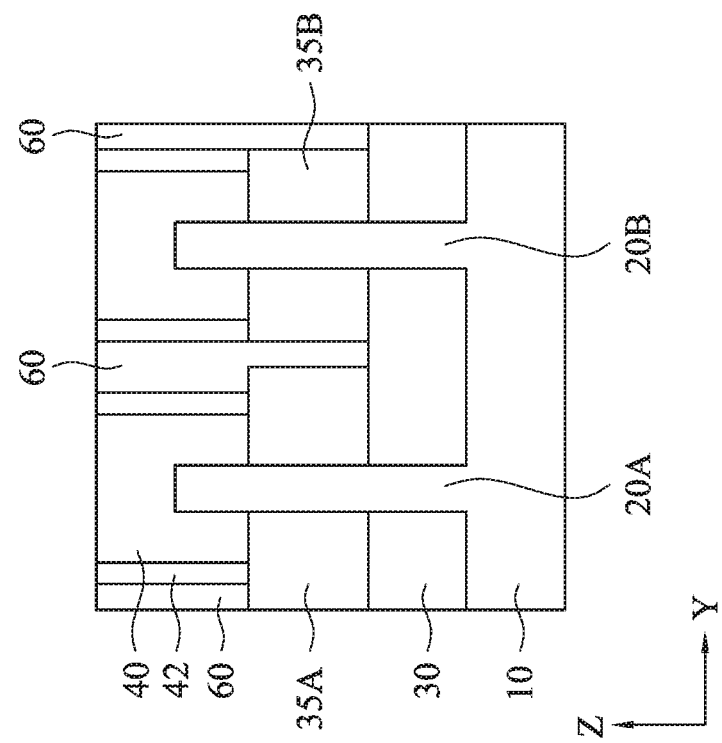
FIG. 12B
FIG. 12A

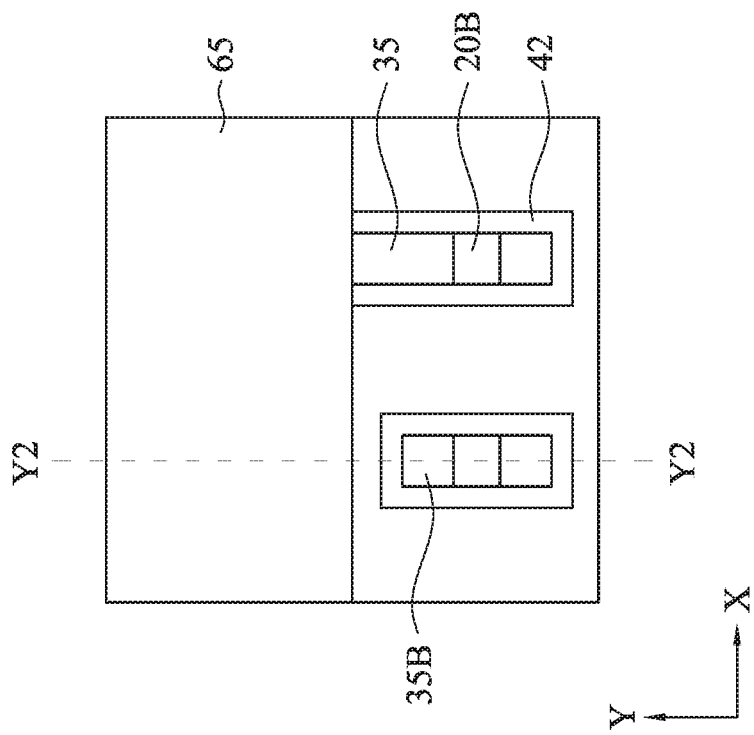
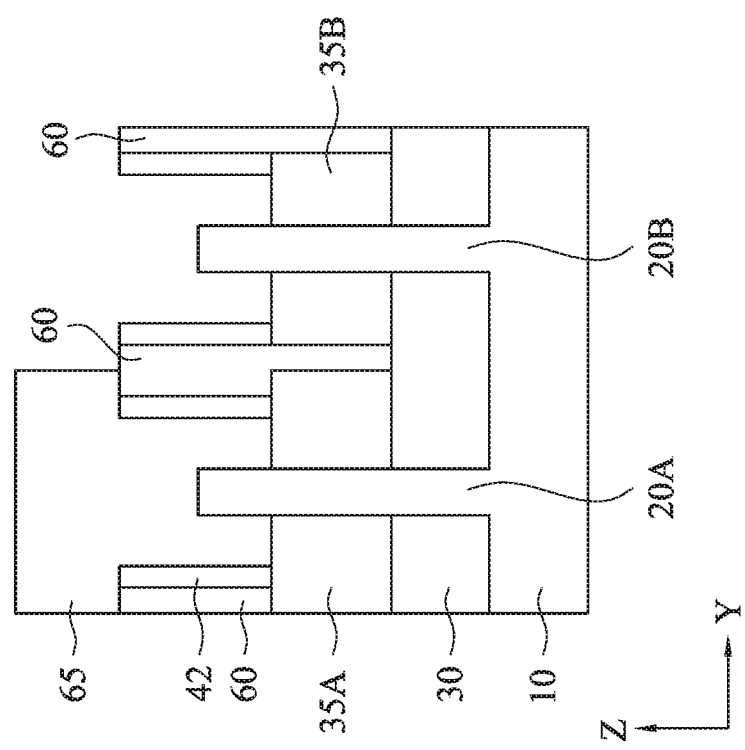
FIG. 14B
FIG. 14A

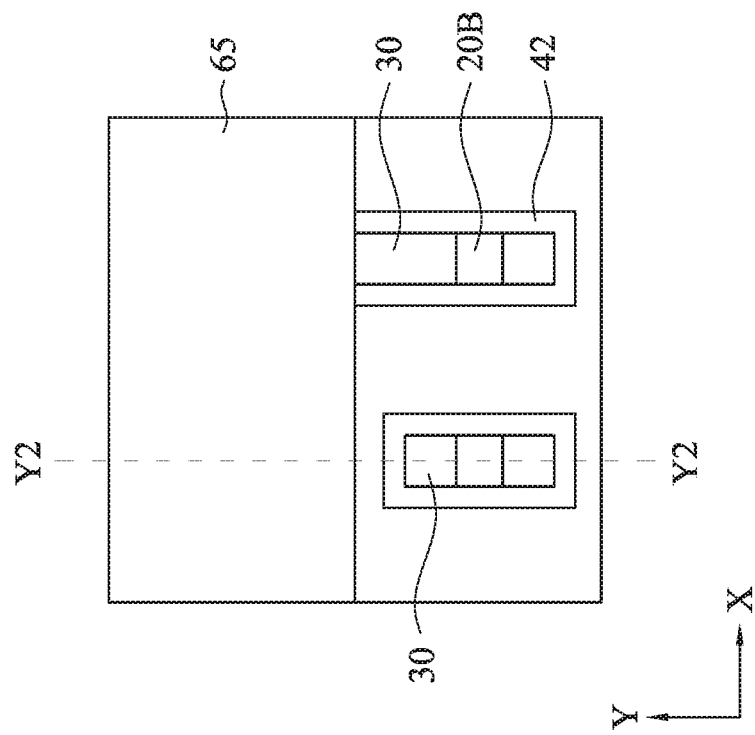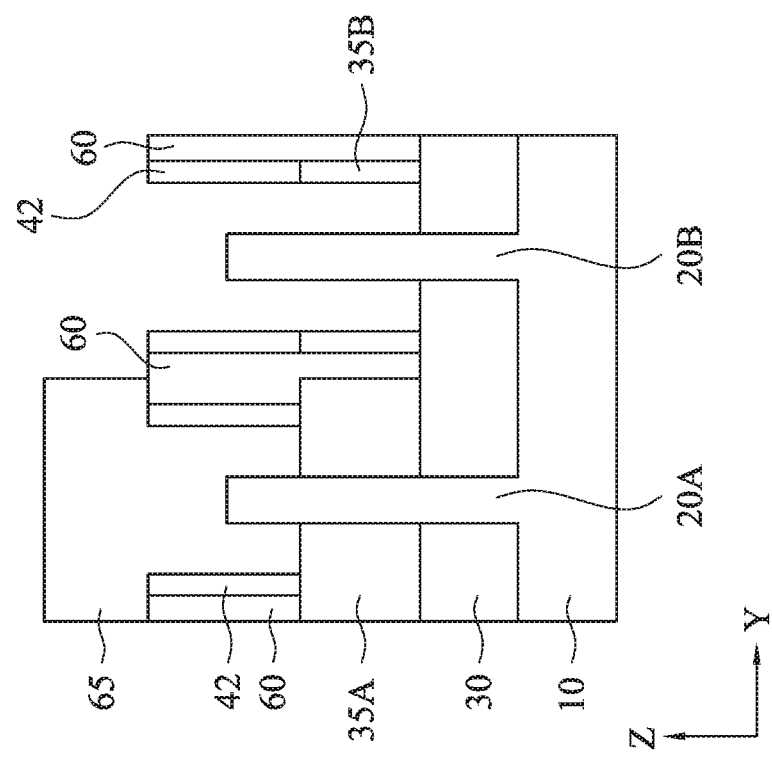
FIG. 15A
FIG. 15B

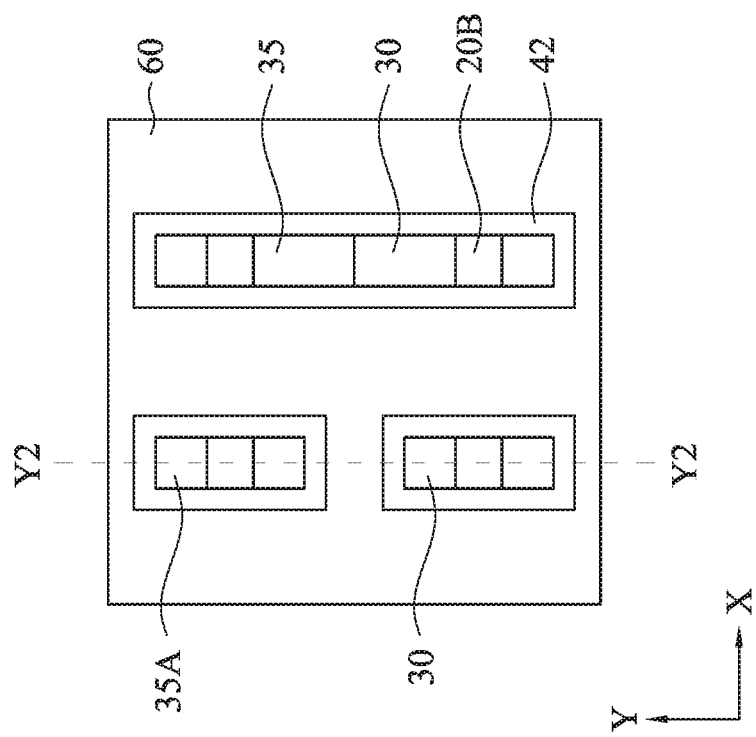
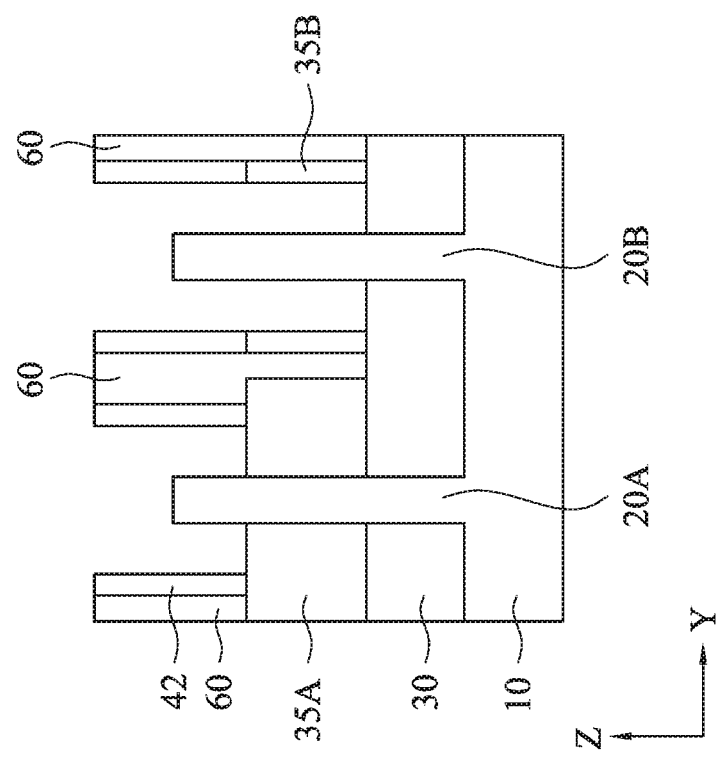
FIG. 16B
FIG. 16A

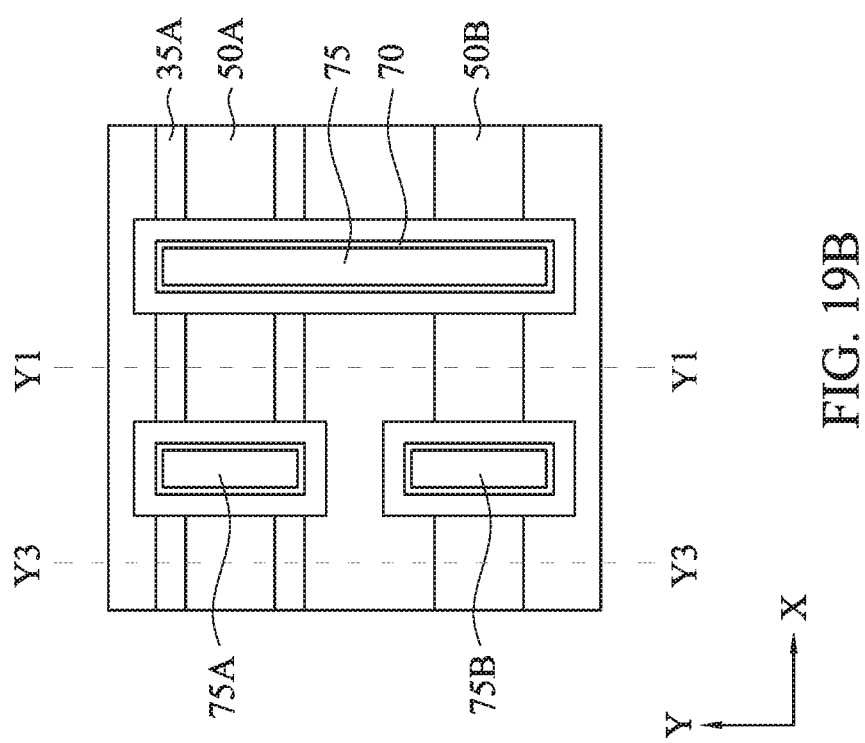
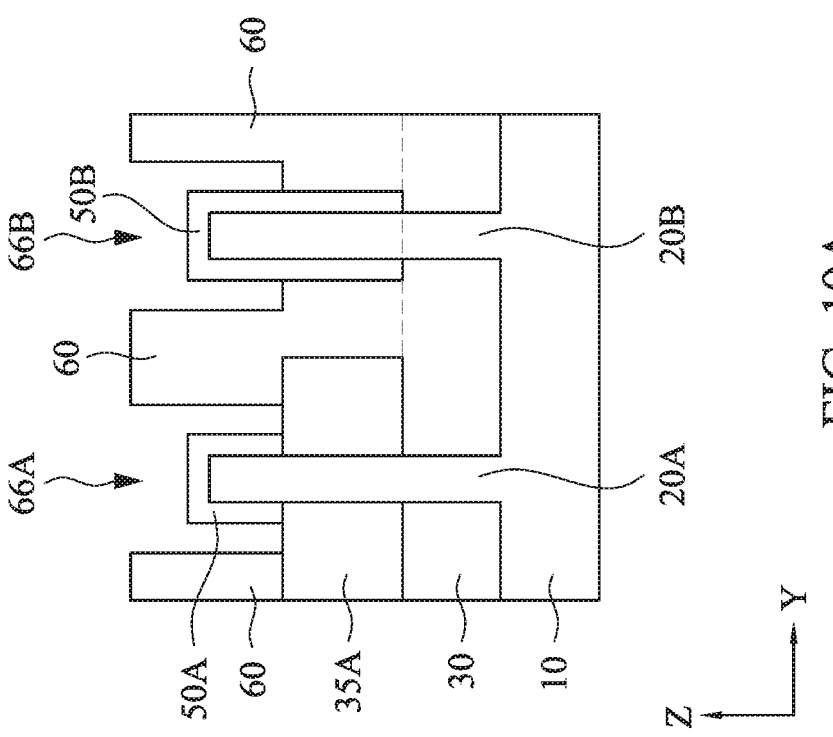
FIG. 19B
FIG. 19A

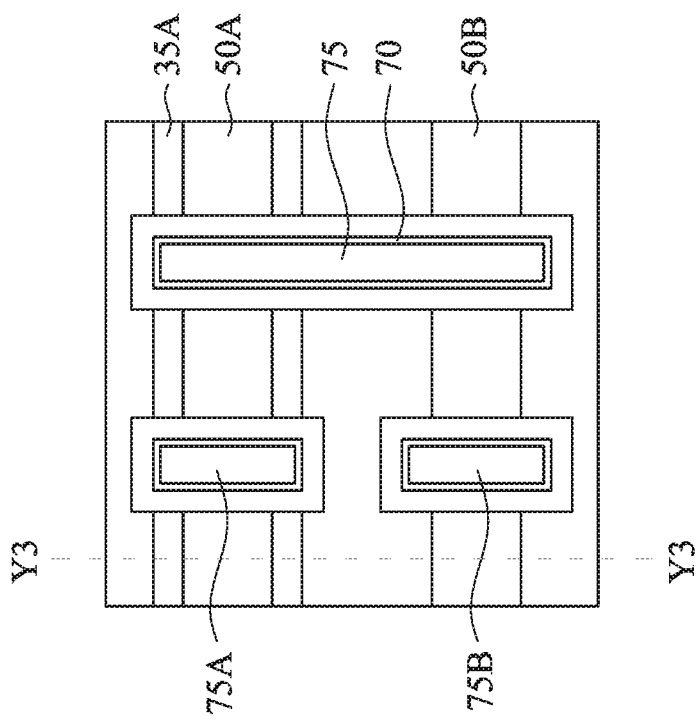
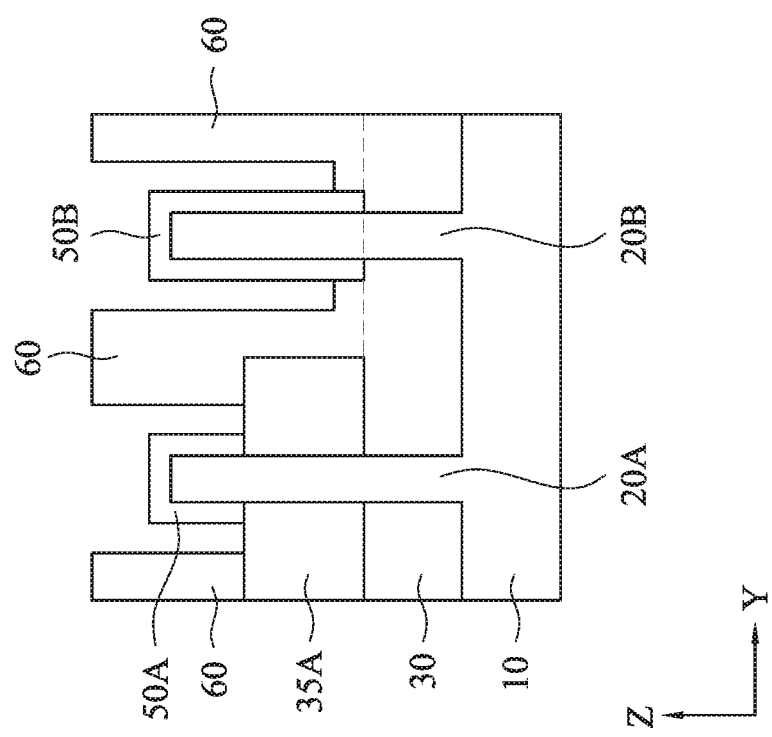
FIG. 20B
FIG. 20A

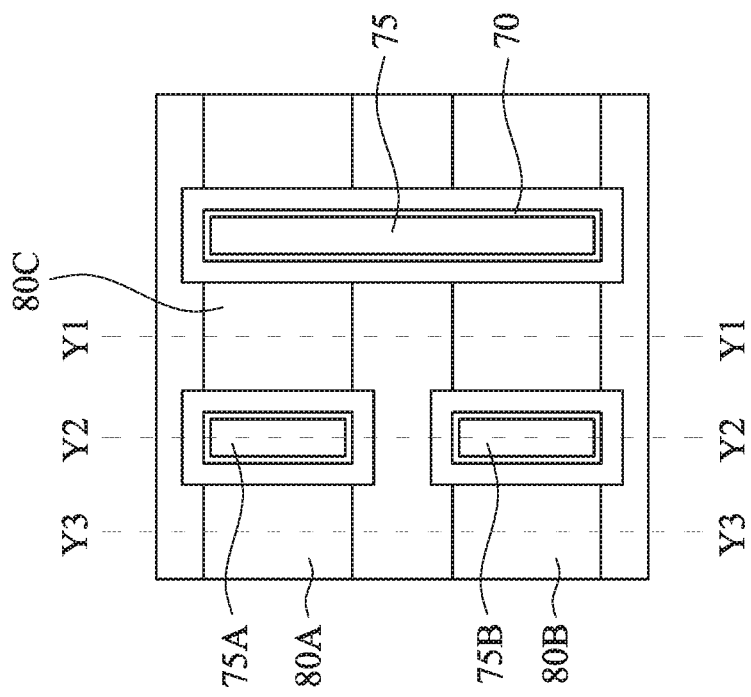
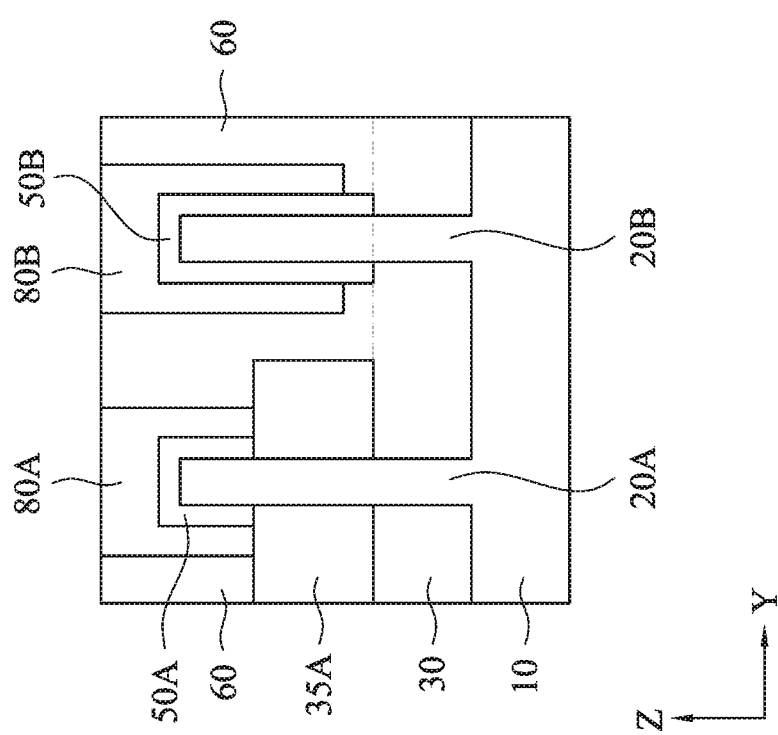
FIG. 21B
FIG. 21A

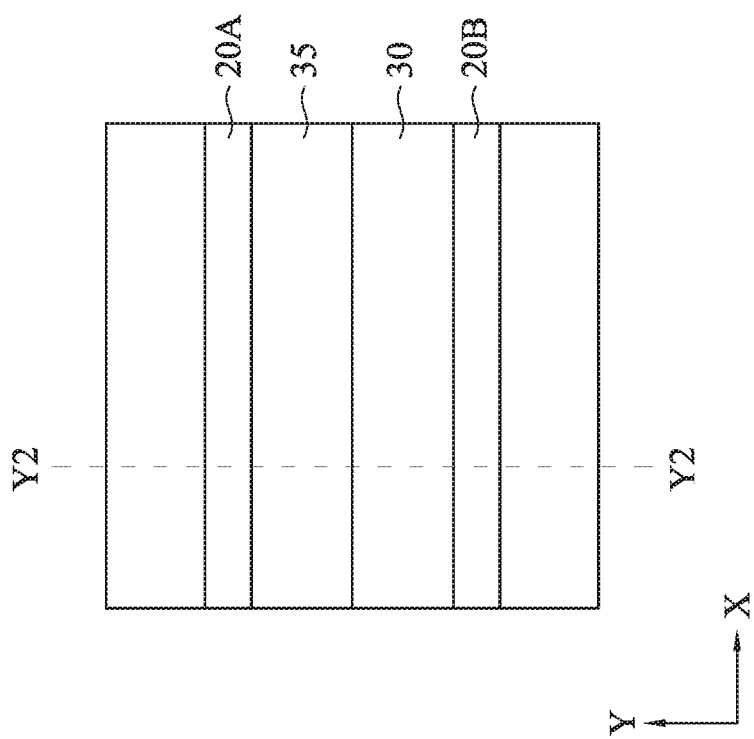
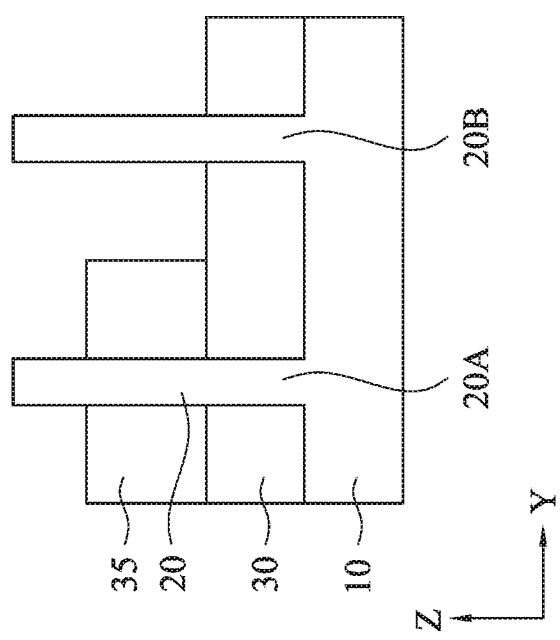
FIG. 22B
FIG. 22A

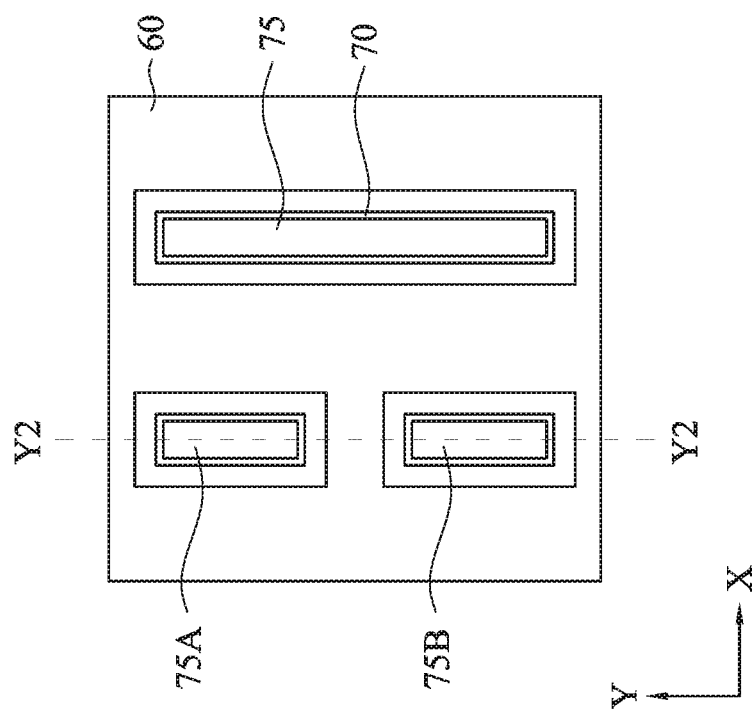
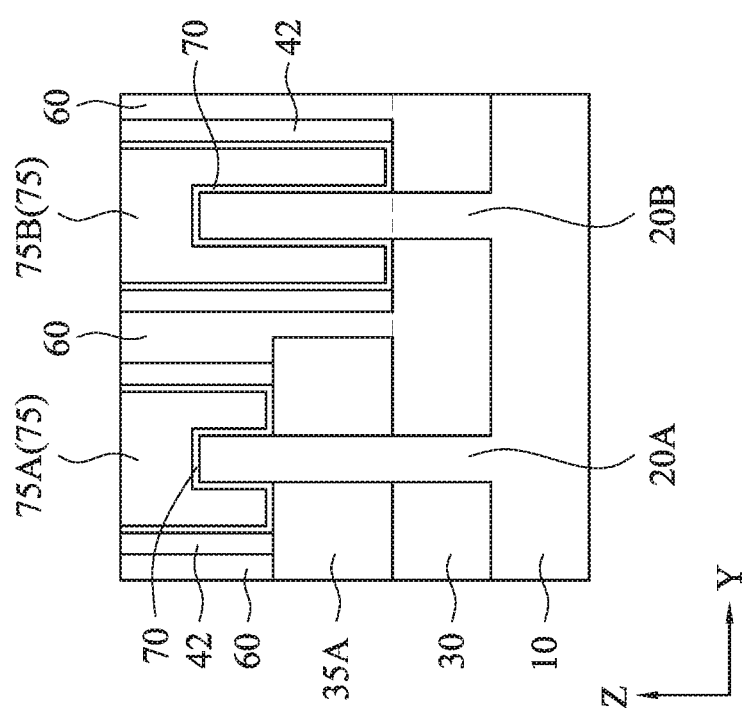
FIG. 25B
FIG. 25A

SEMICONDUCTOR DEVICE INCLUDING FINFETS HAVING DIFFERENT CHANNEL HEIGHTS

RELATED APPLICATIONS

This application is a divisional of U.S. application Ser. No. 15/707,682 filed on Sep. 18, 2017, the entire contents of which are incorporated by reference.

TECHNICAL FIELD

The disclosure relates to a semiconductor integrated circuit, and more particularly to a semiconductor device having fin field effect transistors and their manufacturing process.

BACKGROUND

As the semiconductor industry has progressed into nanometer technology process nodes in pursuit of higher device density, higher performance, and lower costs, challenges from both fabrication and design issues have resulted in the development of three-dimensional designs, such as a multigate field effect transistor (FET), including a fin FET (FinFET) and a gate-all-around (GAA) FET. In a FinFET, a gate electrode layer is adjacent to three side surfaces of a channel region with a gate dielectric layer interposed therebetween. Because the gate structure surrounds (wraps) the fin on three surfaces, the transistor essentially has three gates controlling the current through the fin or channel region. The current driving capacity of the FinFET is generally determined by a number of the fins, a fin width and a fin height at the channel region.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 7A and 7B show one of the various stages of sequential processes for manufacturing a semiconductor device having FinFETs with different fin channel heights according to an embodiment of the present disclosure.

FIGS. 8A and 8B show one of the various stages of sequential processes for manufacturing a semiconductor device having FinFETs with different fin channel heights according to an embodiment of the present disclosure.

FIGS. 12A and 12B show one of the various stages of sequential processes for manufacturing a semiconductor device having FinFETs with different fin channel heights according to an embodiment of the present disclosure.

FIGS. 14A and 14B show one of the various stages of sequential processes for manufacturing a semiconductor device having FinFETs with different fin channel heights according to an embodiment of the present disclosure.

FIGS. 15A and 15B show one of the various stages of sequential processes for manufacturing a semiconductor device having FinFETs with different fin channel heights according to an embodiment of the present disclosure.

FIGS. 16A and 16B show one of the various stages of sequential processes for manufacturing a semiconductor device having FinFETs with different fin channel heights according to an embodiment of the present disclosure.

FIGS. 19A, 19B and 19C show one of the various stages of sequential processes for manufacturing a semiconductor device having FinFETs with different fin channel heights according to an embodiment of the present disclosure.

FIGS. 20A and 20B show one of the various stages of sequential processes for manufacturing a semiconductor device having FinFETs with different fin channel heights according to an embodiment of the present disclosure.

FIGS. 21A, 21B, 21C and 21D show one of the various stages of sequential processes for manufacturing a semiconductor device having FinFETs with different fin channel heights according to an embodiment of the present disclosure.

FIGS. 22A and 22B show one of the various stages of sequential processes for manufacturing a semiconductor device having FinFETs with different fin channel heights according to another embodiment of the present disclosure.

FIGS. 25A and 25B show one of the various stages of sequential processes for manufacturing a semiconductor device having FinFETs with different fin channel heights according to another embodiment of the present disclosure.

DETAILED DESCRIPTION

Figure 1B:
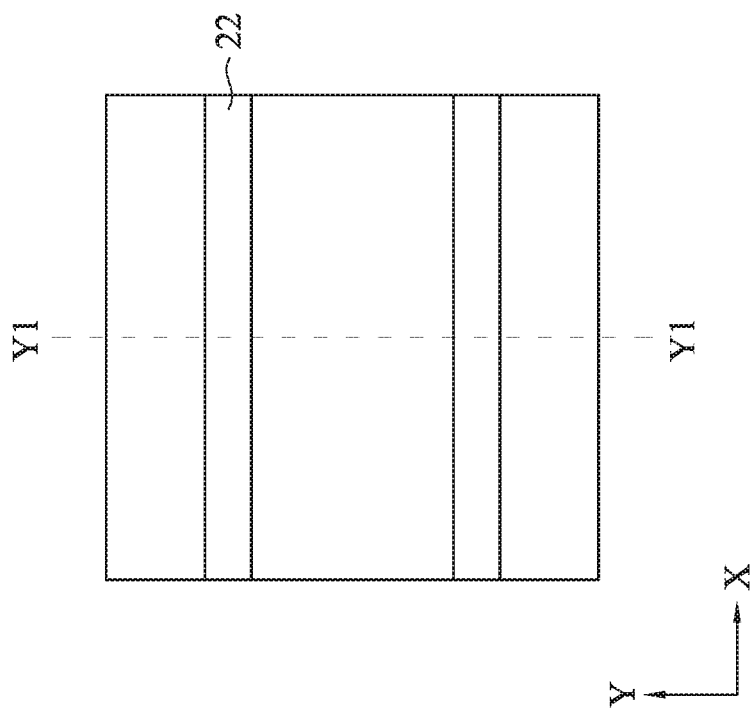
FIGS. 1A and 1B show one of the various stages of sequential processes for manufacturing a semiconductor device having FinFETs with different fin channel heights according to an embodiment of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of."

FinFETs generally include multiple fins to obtain a sufficient drive current. As the size of the semiconductor chip decreases, the number of the fins also decreases and, eventually the number of fins is one. With one fin structure in a FinFET, one possible way to increase the drive current is to increase a fin channel height (height of the channel region of the fin structure).

In a logic circuit, some transistors drive a large capacitive load, and others drive a small load. Transistors that drive a large load require a high drive strength (driving current $I_{eff}$) to meet speed requirements, as the speed $\sim I_{eff}/C_{load}V_{dd}$, where $C_{load}$ is a capacitance of the load and $V_{dd}$ is power supply voltage. For a FinFET, when a load to be driven by a FinFET is low, an energy-delay-product will increase as the fin height increases, while when the load is high, the energy-delay-product decreases as the fin height increases.

Accordingly, the present disclosure provides a semiconductor device, such as a logic circuit and a static random access memory (SRAM) having multiple FinFETs with different fin channel heights for different driving characteristics. The semiconductor device according to the present embodiments can improve tradeoff between the speed and the power consumption by utilizing low fins for FinFETs that drive a small load, and tall fins for FinFETs that drive a large load.

FIGS. 1-21D show sequential processes for manufacturing a semiconductor device having FinFETs with different fin channel heights according to an embodiment of the present disclosure. It is understood that additional operations can be provided before, during, and after processes shown by FIGS. 1-21D, and some of the operations described below can be replaced or eliminated, for additional embodiments of the method. The order of the operations/processes may be interchangeable. In FIGS. 1-21D, the "A" figures (FIG. 1A, 2A, ...) show cross sectional views along the Y direction, the "B" figures (FIGS. 1B, 2B, ...) show plan views (top views) and the "C" figures (FIGS. 10C, etc.) show cross sectional views along the Y direction.

Figure 1A:
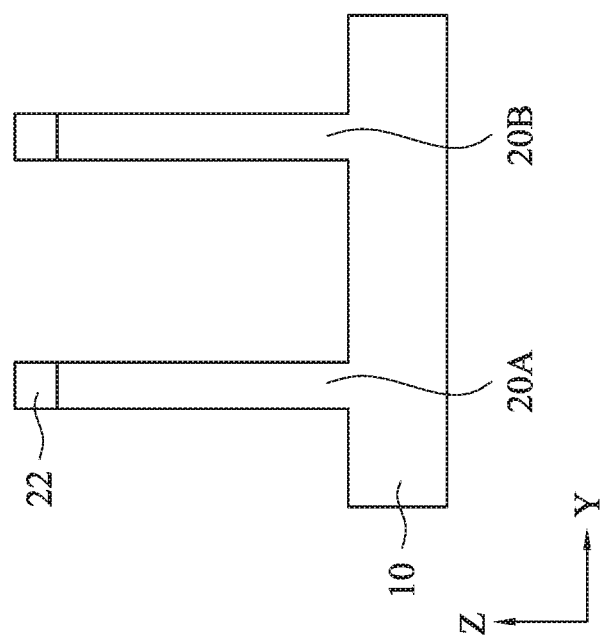

FIGS. 1A and 1B show one of the various stages of sequential processes for manufacturing a semiconductor device having FinFETs with different fin channel heights according to an embodiment of the present disclosure. FIG. 1A is a cross sectional view corresponding to line Y1-Y1 of FIG. 1B.

As shown in FIGS. 1A and 1B, fin structures 20A and 20B are formed over a substrate 10. In one embodiment, substrate 10 includes a single crystalline semiconductor layer on at least its surface portion. The substrate 10 may comprise a single crystalline semiconductor material such as, but not limited to Si, Ge, SiGe, GaAs, InSb, GaP, GaSb, InAlAs, InGaAs, GaSbP, GaAsSb and InP. In this embodiment, the substrate 10 is made of Si.

The substrate 10 may include in its surface region, one or more buffer layers (not shown). The buffer layers can serve to gradually change the lattice constant from that of the substrate to that of the source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. In a particular embodiment, the substrate 10 comprises silicon germanium (SiGe) buffer layers epitaxially grown on the silicon substrate 10. The germanium concentration of the SiGe buffer layers may increase from 30 atomic % germanium for the bottom-most buffer layer to 70 atomic % germanium for the top-most buffer layer. The substrate 10 may include various regions that have been suitably doped with impurities (e.g., p-type or n-type conductivity).

The fin structures 20A, 20B may be patterned by any suitable method. For example, the fin structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a dummy layer is formed over a substrate and patterned using a photolithography process. Spacers are formed alongside the patterned dummy layer using a self-aligned process. The dummy layer is then removed, and the remaining spacers may then be used to pattern the fins.

In other embodiments, the fin structures can be patterned by using a hard mask pattern 22 as an etching mask. In some embodiments, the hard mask pattern 22 includes a first mask layer and a second mask layer disposed on the first mask layer. The first mask layer is a pad oxide layer made of a silicon oxide, which can be formed by a thermal oxidation. The second mask layer is made of a silicon nitride (SiN), which is formed by chemical vapor deposition (CVD), including low pressure CVD (LPCVD) and plasma enhanced CVD (PECVD), physical vapor deposition (PVD), atomic layer deposition (ALD), or other suitable process. The deposited hard mask layer is patterned into a hard mask pattern 22 by using patterning operations including photolithography and etching. Then, the substrate 10 is patterned by using the hard mask pattern into fin structures 20A and 20B, both extending in the X direction. In FIGS. 1A and 1B, two fin structures 20A and 20B are arranged in the Y direction. But the number of the fin structures is not limited to, and may three or more. In some embodiments, one or more dummy fin structures are formed on both sides of the fin structures to improve pattern fidelity in the patterning operations.

The width of the upper portion of the fin structure along the Y direction is in a range from about 5 nm to about 40 nm in some embodiments, and is in a range from about 10 nm to about 20 nm in other embodiments. The height along the Z direction of the fin structure is in a range from about 100 nm to about 200 nm in some embodiments.

Figure 2B:
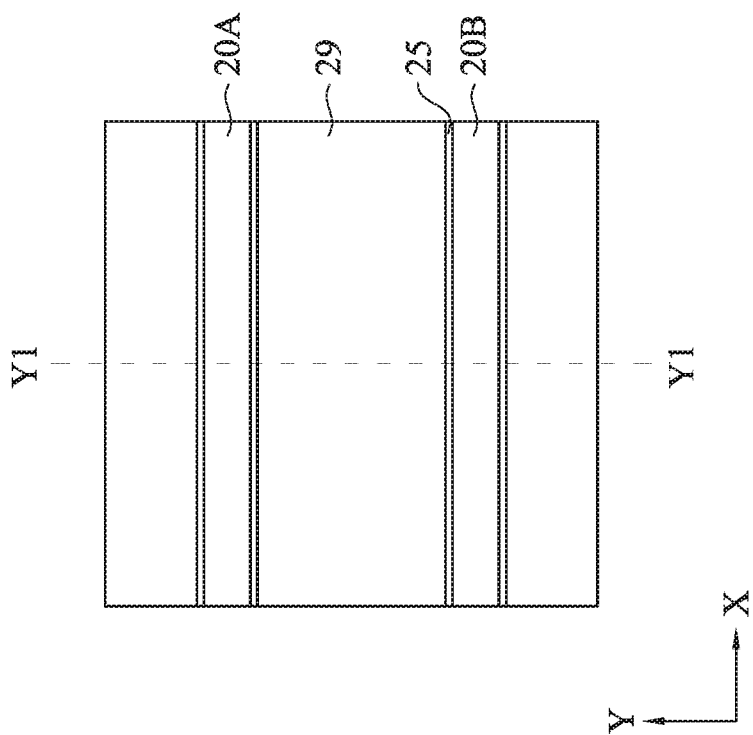
FIGS. 2A and 2B show one of the various stages of sequential processes for manufacturing a semiconductor device having FinFETs with different fin channel heights according to an embodiment of the present disclosure.
Figure 2A:
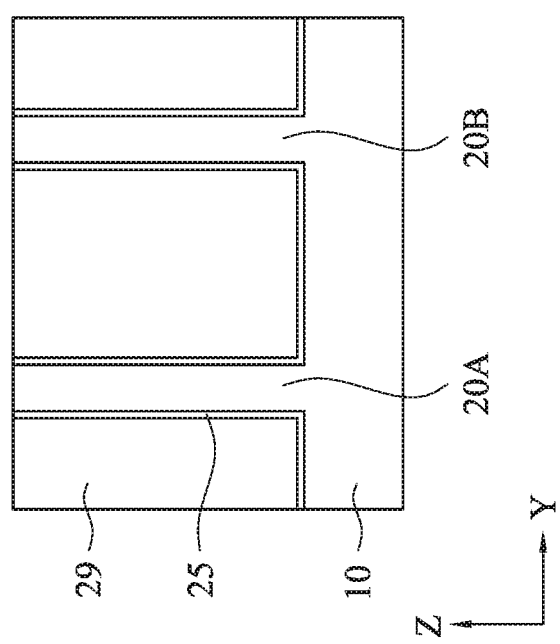

FIGS. 2A and 2B show one of the various stages of sequential processes for manufacturing a semiconductor device having FinFETs with different fin channel heights according to an embodiment of the present disclosure. FIG. 2A is a cross sectional view corresponding to line Y1-Y1 of FIG. 2B.

After the fin structures 20A and 20B are formed, a first insulating material layer 29 including one or more layers of insulating material is formed over the substrate 10 so that the fin structures 20A and 20B are fully embedded in the first insulating material layer 29. The insulating material for the first insulating material layer 29 may include silicon oxide, silicon nitride, silicon oxynitride (SiON), SiCN, fluorine-doped silicate glass (FSG), or a low-K dielectric material, formed by LPCVD (low pressure chemical vapor deposition), plasma-CVD or flowable CVD or any other suitable film formation methods. In some embodiments, the first insulating material layer 29 is made of silicon oxide. An anneal operation may be performed after the formation of the first insulating material layer 29. Then, a planarization operation, such as a chemical mechanical polishing (CMP) method and/or an etch-back method, is performed such that the hard mask patterns 22 are removed and upper surfaces of the fin structures 20A and 20B are exposed from the first insulating material layer 29 as shown in FIG. 2A.

In embodiments, one or more fin liner layers 25 are formed over the fin structures before forming the first insulating material layer 29. The fin liner layer 25 may be made of SiN or a silicon nitride-based material (e.g., SiON or SiCN).

Figure 3B:
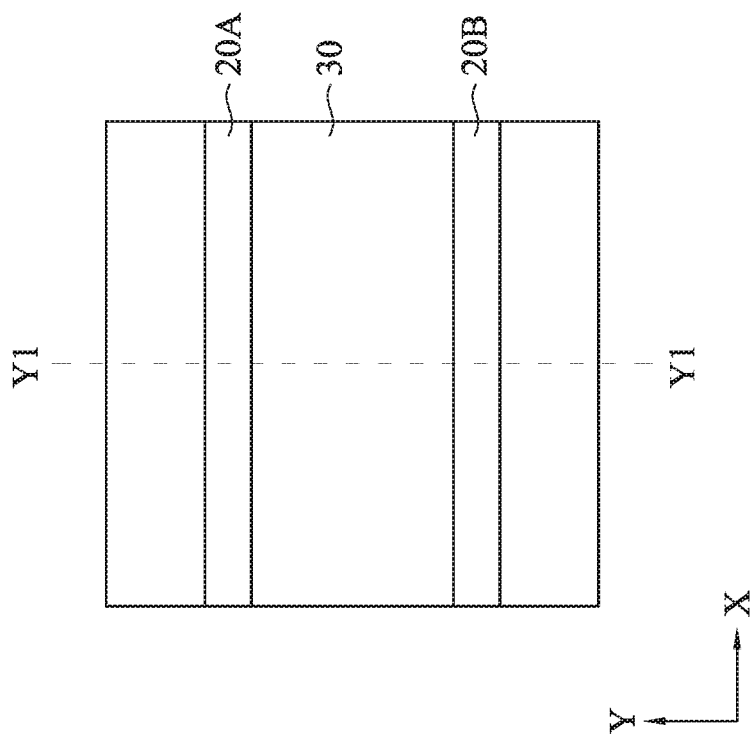
FIGS. 3A and 3B show one of the various stages of sequential processes for manufacturing a semiconductor device having FinFETs with different fin channel heights according to an embodiment of the present disclosure.
Figure 3A:
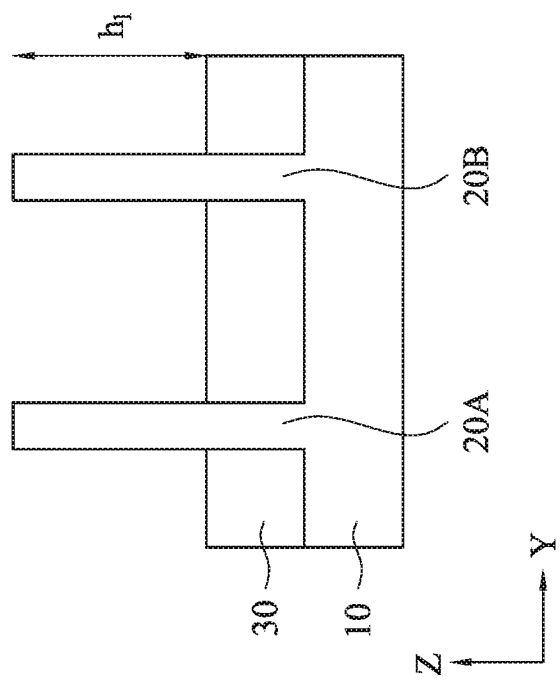

FIGS. 3A and 3B show one of the various stages of sequential processes for manufacturing a semiconductor device having FinFETs with different fin channel heights according to an embodiment of the present disclosure. FIG. 3A is a cross sectional view corresponding to line Y1-Y1 of FIG. 3B.

Then, as shown in FIG. 3A, the first insulating material layer 29 is recessed to form a first isolation insulating layer 30 so that the upper portions of the fin structures 20A and 20B are exposed. With this operation, the fin structures 20A and 20B are electrically separated from each other by the first isolation insulating layer 30, which is also called a shallow trench isolation (STI). After the recess etching, the height $h_1$ of the exposed fin structures is in a range from about 50 nm to about 100 nm in some embodiments, and is in a range from about 60 nm to about 80 nm in other embodiments.

Figure 4B:
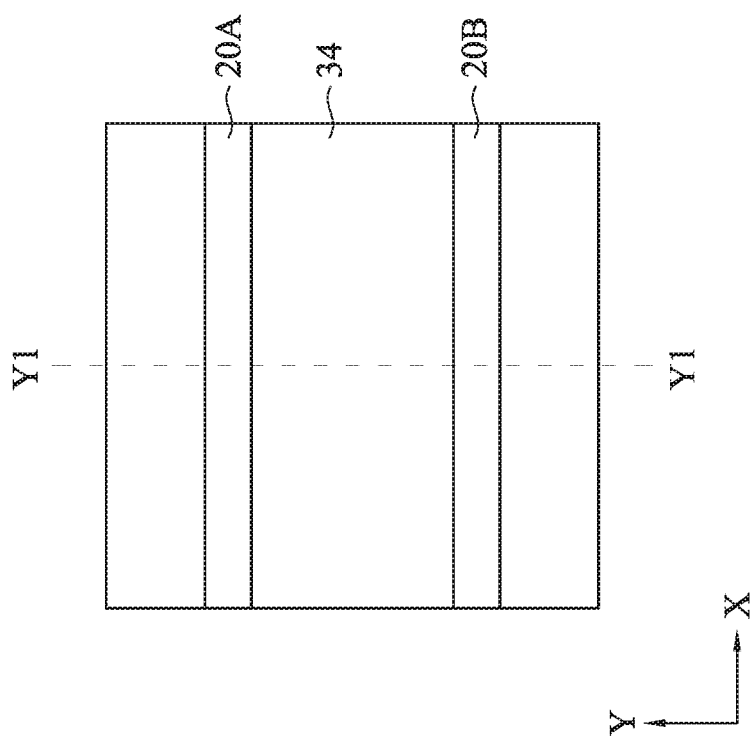
FIGS. 4A and 4B show one of the various stages of sequential processes for manufacturing a semiconductor device having FinFETs with different fin channel heights according to an embodiment of the present disclosure.
Figure 4A:
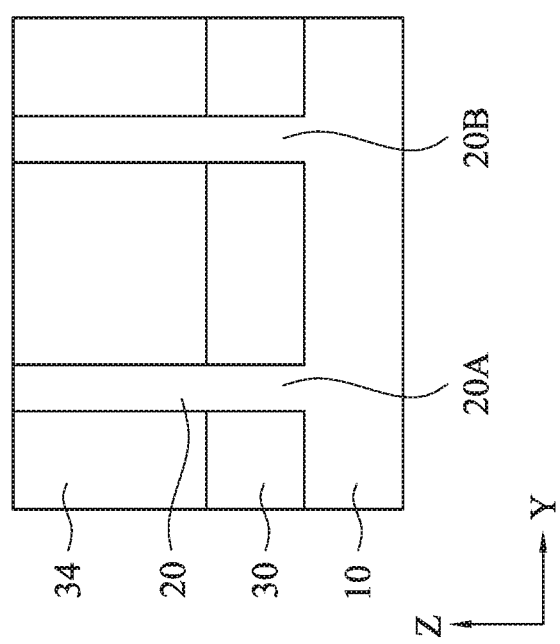

FIGS. 4A and 4B show one of the various stages of sequential processes for manufacturing a semiconductor device having FinFETs with different fin channel heights according to an embodiment of the present disclosure. FIG. 4A is a cross sectional view corresponding to line Y1-Y1 of FIG. 4B.

Further, a second insulating material layer 34 including one or more layers of insulating material is formed over the first isolation insulating layer 30 so that the fin structures 20A and 20B are fully embedded in the second insulating material layer 34, as shown in FIG. 4A. The insulating material for the second insulating material layer 34 is different from that of the first isolation insulating layer, and may include silicon oxide, silicon nitride, silicon oxynitride (SiON), SiOCN, SiOC, SiCN, fluorine-doped silicate glass (FSG), or a low-k dielectric material, formed by LPCVD (low pressure chemical vapor deposition), plasma-CVD, atomic layer deposition (ALD) or flowable CVD, or any other suitable film formation methods. In some embodiments, the second insulating material layer 34 includes SiOC or SiOCN. An anneal operation may be performed after the formation of the second insulating material layer 34. Then, a planarization operation, such as a chemical mechanical polishing (CMP) method and/or an etch-back method, is performed such that the upper surfaces of the fin structures 20A and 20B are exposed from the second insulating material layer 34 as shown in FIG. 4A.

Figure 5B:
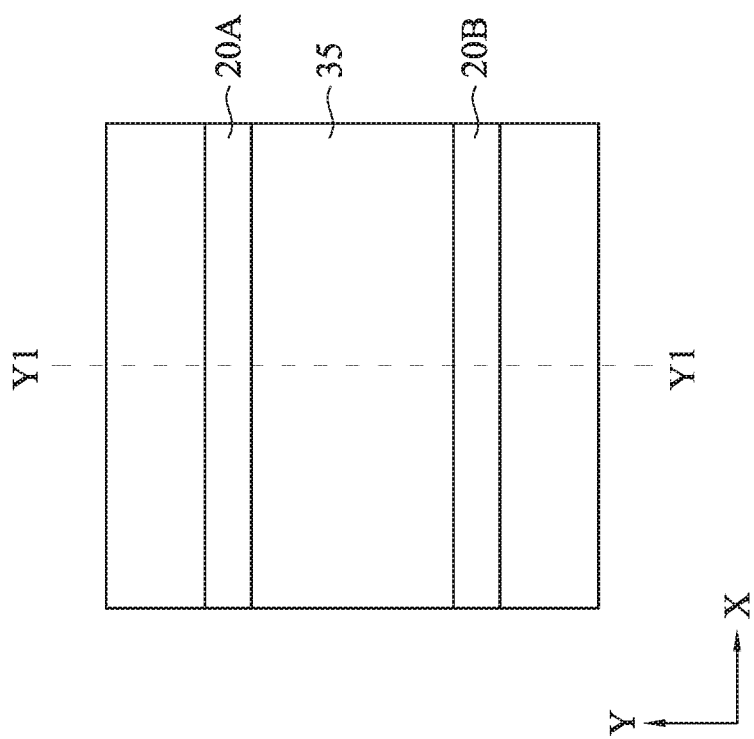
FIGS. 5A and 5B show one of the various stages of sequential processes for manufacturing a semiconductor device having FinFETs with different fin channel heights according to an embodiment of the present disclosure.
Figure 5A:
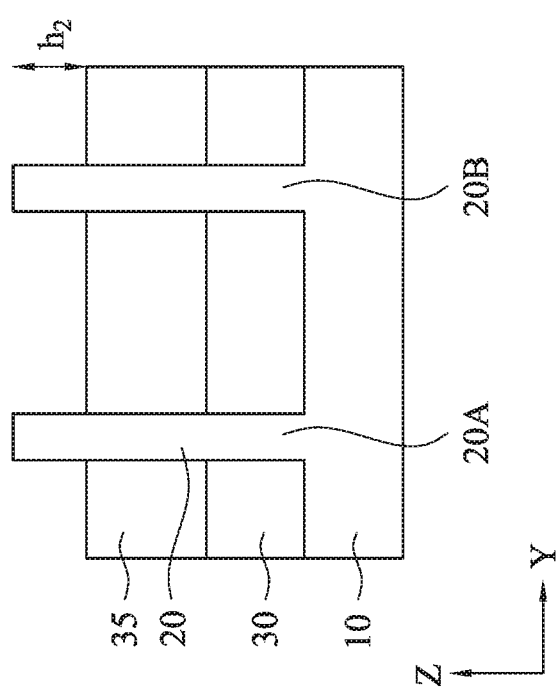

FIGS. 5A and 5B show one of the various stages of sequential processes for manufacturing a semiconductor device having FinFETs with different fin channel heights according to an embodiment of the present disclosure. FIG. 5A is a cross sectional view corresponding to line Y1-Y1 of FIG. 5B.

Then, as shown in FIG. 5A, the second insulating material layer 34 is recessed to form a second isolation insulating layer 35 so that the upper portions of the fin structures 20A and 20B are exposed. After the recess etching, the height $h_2$ of the exposed fin structures is smaller than $h_1$ and is in a range from about 15 nm to about 50 nm in some embodiments, and is in a range from about 20 nm to about 40 nm in other embodiments. In some embodiments, $h_1/h_2$ is in a range from about 1.5 to about 5.0, and is in a range from about 1.5 to about 3.0 in other embodiments.

Figure 6B:
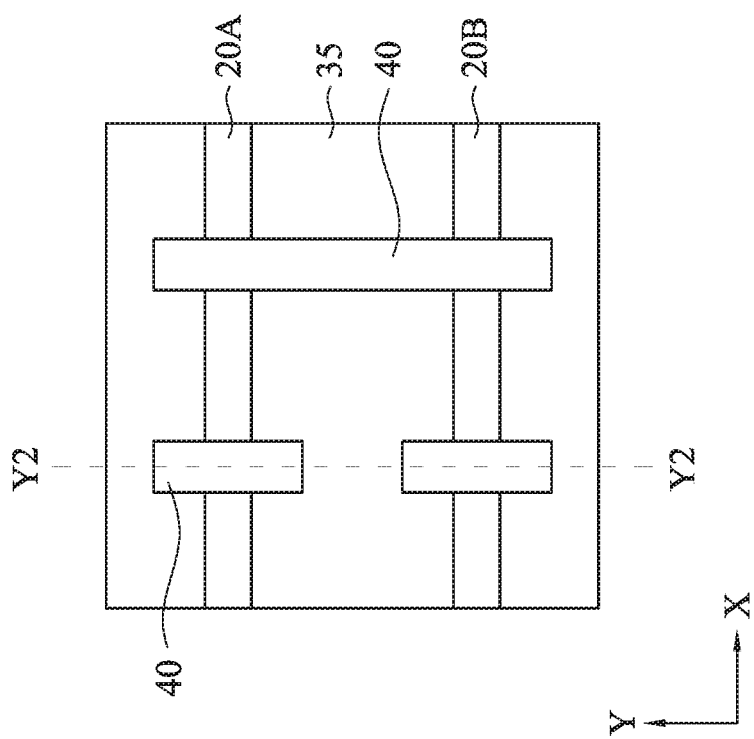
FIGS. 6A and 6B show one of the various stages of sequential processes for manufacturing a semiconductor device having FinFETs with different fin channel heights according to an embodiment of the present disclosure.
Figure 6A:
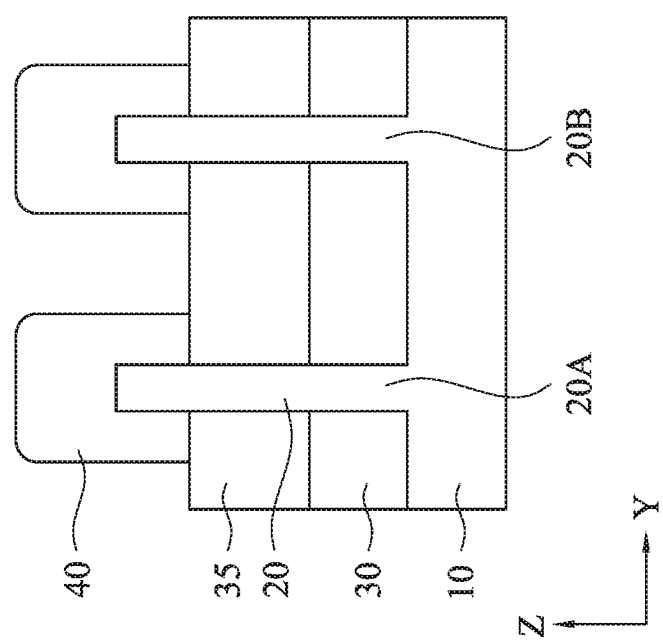

FIGS. 6A and 6B show one of the various stages of sequential processes for manufacturing a semiconductor device having FinFETs with different fin channel heights according to an embodiment of the present disclosure. FIG. 6A is a cross sectional view corresponding to line Y2-Y2 of FIG. 6B.

After the second isolation insulating layer 35 is formed, a dummy gate structure 40 is formed, as shown in FIGS. 6A and 6B. The dummy gate structure 40 includes a dummy gate dielectric layer and a dummy gate electrode layer. The dummy gate dielectric layer includes one or more layers of insulating material, such as a silicon oxide-based material. In one embodiment, silicon oxide formed by CVD is used. The thickness of the dummy gate dielectric layer is in a range from about 1 nm to about 5 nm in some embodiments.

The dummy gate structure 40 is formed by first blanket depositing the dummy gate dielectric layer over the exposed fin structures 20A and 20B and the upper surface of the second isolation insulating layer 35. A dummy gate electrode layer is then blanket deposited on the dummy gate dielectric layer, such that the fin structures are fully embedded in the dummy gate electrode layer. The dummy gate electrode layer includes silicon such as polycrystalline silicon (polysilicon) or amorphous silicon. In some embodiments, the dummy gate electrode layer is made of polysilicon. The thickness of the dummy gate electrode layer is in a range from about 100 nm to about 200 nm in some embodiments. In some embodiments, the dummy gate electrode layer is subjected to a planarization operation. The dummy gate dielectric layer and the dummy gate electrode layer are deposited using CVD, including LPCVD and PECVD, PVD, ALD, or other suitable process. Subsequently, a mask layer is formed over the dummy gate electrode layer. The mask layer can be a resist pattern or a hard mask pattern.

Next, a patterning operation is performed on the mask layer and dummy gate electrode layer is patterned into the dummy gate structures 40, as shown in FIGS. 6A and 6B. By patterning the dummy gate structures, the upper portions of the fin structures 20A and 20B, which are to be source/drain regions, are partially exposed on opposite sides of the dummy gate structures, as shown in FIG. 6B. In this disclosure, a source and a drain are interchangeably used and the structures thereof are substantially the same. In FIG. 6B, two dummy gate structures 40 are formed on two fin structures 20A and 20B, respectively, and one dummy gate structure 40 is formed over two fin structures 20A and 20B. However, the layout is not limited to FIG. 6B.

The width of the dummy gate structures 40 in the Y direction is in a range from about 5 nm to about 30 nm in some embodiments, and is in a range from about 7 nm to about 15 nm in other embodiments. A pitch of the dummy gate structures is in a range from about 10 nm to about 50 nm in some embodiments, and is in a range from about 15 nm to about 40 nm in other embodiments.

FIGS. 7A and 7B show one of the various stages of sequential processes for manufacturing a semiconductor device having FinFETs with different fin channel heights according to an embodiment of the present disclosure. FIG. 7A is a cross sectional view corresponding to line Y2-Y2 of FIG. 7B.

After the dummy gate structures 40 are formed, a blanket layer of an insulating material for sidewall spacers 42 is conformally formed by using CVD or other suitable methods. The blanket layer is deposited in a conformal manner so that it is formed to have substantially equal thicknesses on vertical surfaces, such as the sidewalls, horizontal surfaces, and the top of the dummy gate structures. In some embodiments, the blanket layer is deposited to a thickness in a range from about 2 nm to about 20 nm. In one embodiment, the insulating material of the blanket layer is different from the materials of the first isolation insulating layer and the second isolation insulating layer, and is made of a silicon nitride-based material, such as SiN, SiON, SiOCN or SiCN and combinations thereof. In some embodiments, the blanket layer (sidewall spacers 42) is made of SiN. The sidewall spacers 42 are formed on opposite sidewalls of the dummy gate structures 40, by anisotropic etching, as shown in FIGS. 7A and 7B.

FIGS. 8A and 8B show one of the various stages of sequential processes for manufacturing a semiconductor device having FinFETs with different fin channel heights according to an embodiment of the present disclosure. FIG. 8A is a cross sectional view corresponding to line Y2-Y2 of FIG. 8B.

After the sidewall spacers 42 are formed, the area around the fin structure 20A, which will subsequently be a FinFET with a shorter fin channel height (a shorter FinFET), is covered by a cover layer 45, as shown in FIGS. 8A and 8B. In some embodiments, the cover layer 45 is a photo resist pattern.

Figure 9B:
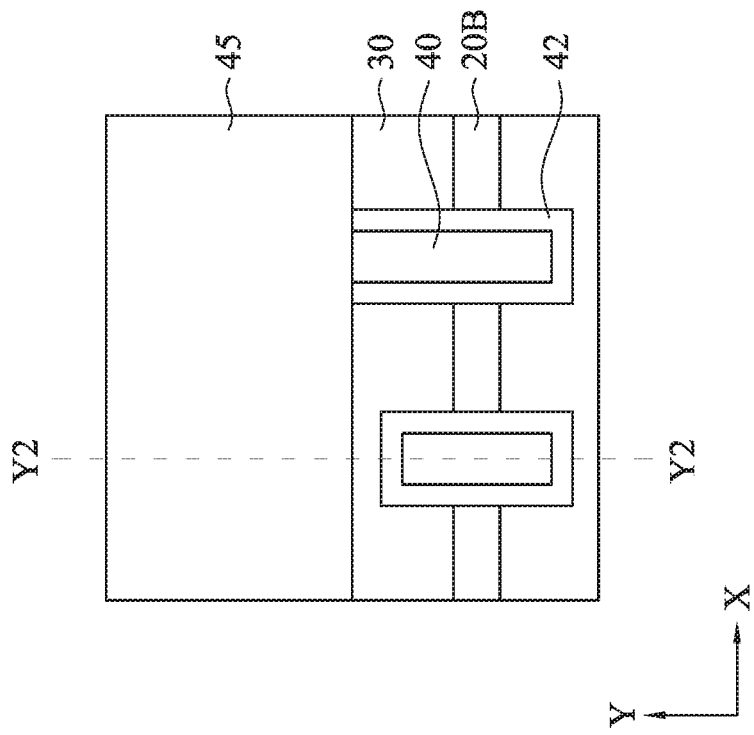
FIGS. 9A and 9B show one of the various stages of sequential processes for manufacturing a semiconductor device having FinFETs with different fin channel heights according to an embodiment of the present disclosure.
Figure 9A:
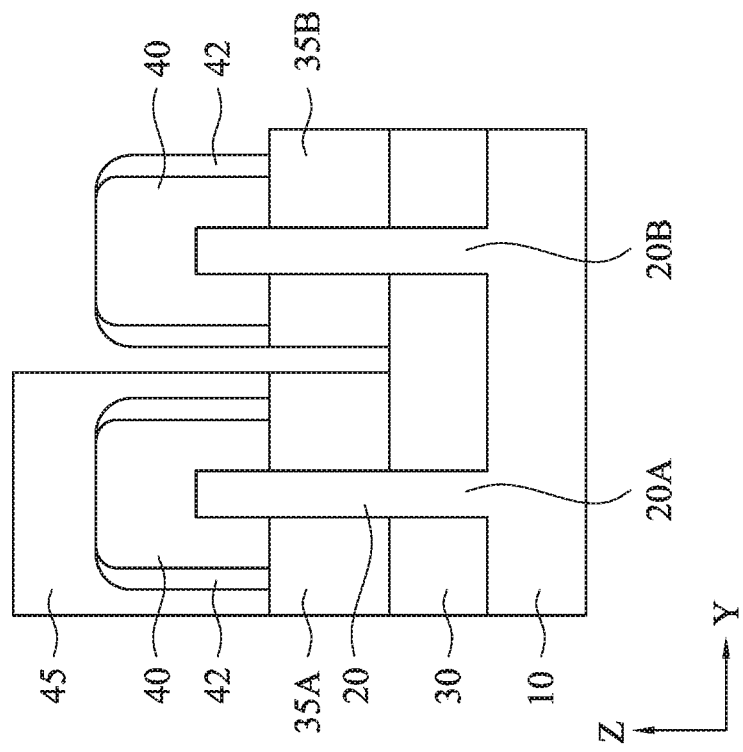

FIGS. 9A and 9B show one of the various stages of sequential processes for manufacturing a semiconductor device having FinFETs with different fin channel heights according to an embodiment of the present disclosure. FIG. 9A is a cross sectional view corresponding to line Y2-Y2 of FIG. 9B.

By using the cover layer 45 and the dummy gate structure 40 with the sidewall spacer 42 as etching masks, the second isolation insulating layer 35 is etched as shown in FIG. 9A. Since the second isolation insulating layer 35 is made of a different material than the first isolation insulating layer 30 and the sidewall spacers 42, the second isolation insulating layer 35 can be selectively etched, and the etching substantially stops at the first isolation insulating layer 30. After the etching, the second isolation insulating layer 35A remains under the cover layer 45 and the second isolation insulating layer 35B remains under the dummy gate structure in an area around the fin structure 20B, which will subsequently be a FinFET with a taller fin channel height (a tall FinFET).

Figure 10B:
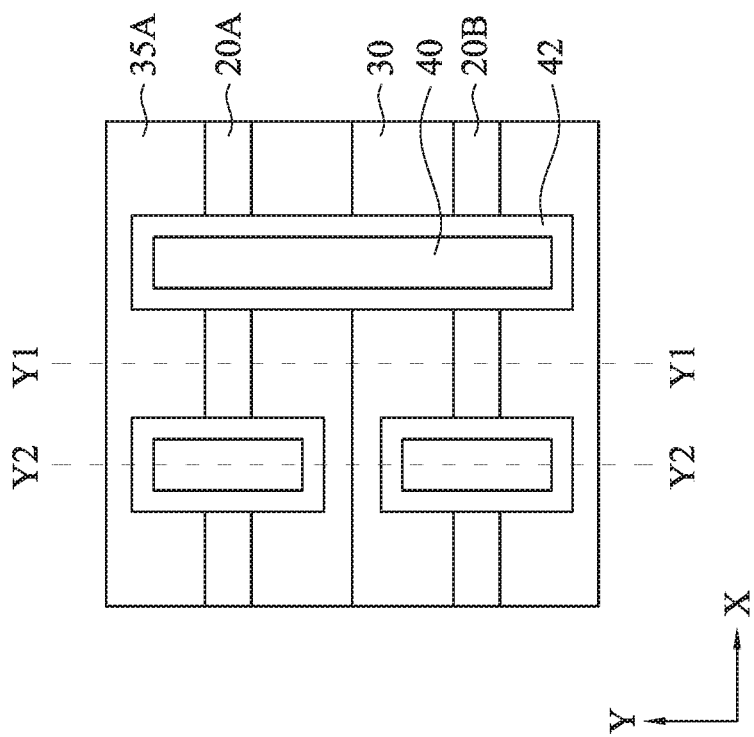
FIGS. 10A, 10B and 10C show one of the various stages of sequential processes for manufacturing a semiconductor device having FinFETs with different fin channel heights according to an embodiment of the present disclosure.
Figure 10A:
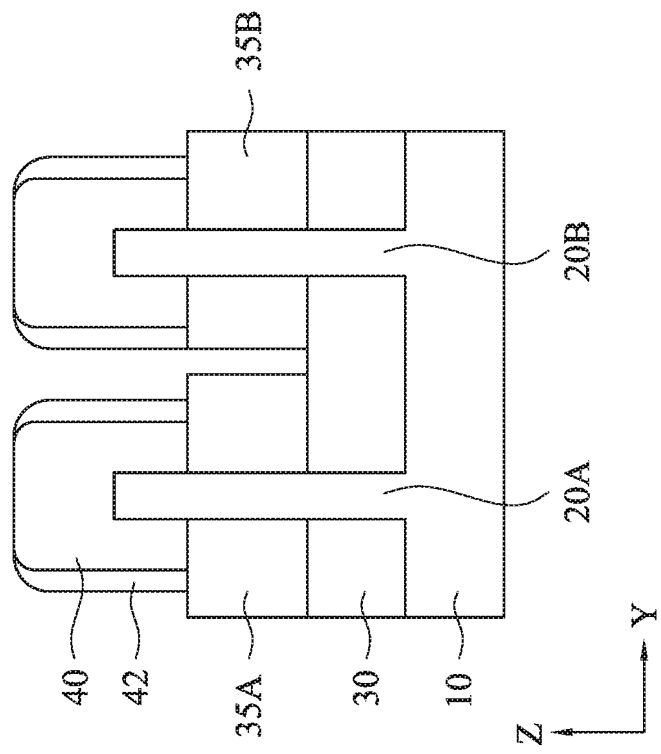
Figure 10C:
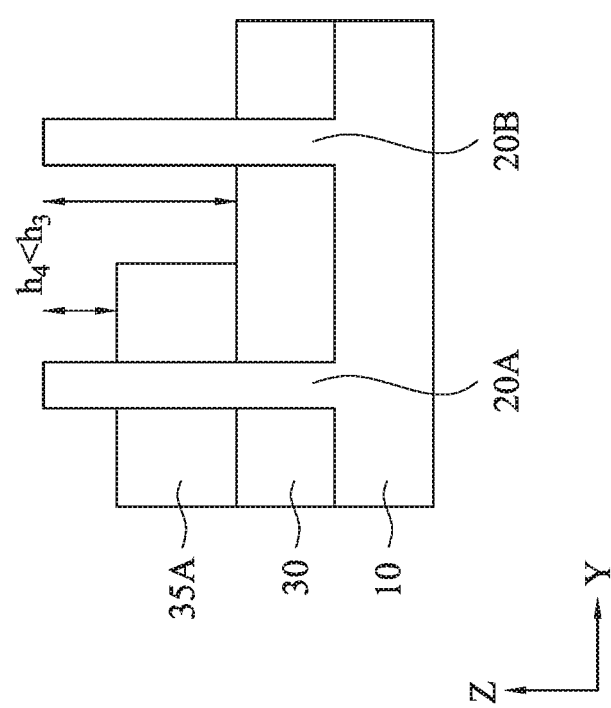

FIGS. 10A-10C show one of the various stages of sequential processes for manufacturing a semiconductor device having FinFETs with different fin channel heights according to an embodiment of the present disclosure. FIG. 10A is a cross sectional view corresponding to line Y2-Y2 of FIG. 10B and FIG. 10C is a cross sectional view corresponding to line Y1-Y1 of FIG. 10B.

After the etching of the second isolation insulating layer 35, the cover layer 45 is removed, as shown in FIGS. 10A-10C. As shown in FIG. 10C, the source/drain regions of the fin structures 20A and 20B are exposed, and the source/drain regions of the fin structure 20A has a height $h_4$ smaller than a height $h_3$ of the source/drain regions of the fin structure 20B. The height $h_3$ is substantially equal to the height $h_1$ and the height $h_4$ is substantially equal to the height $h_2$. In some embodiments, $h_3/h_4$ is in a range from about 1.5 to about 5.0, and is in a range from about 1.5 to about 3.0 in other embodiments.

As shown in FIG. 10C, the FinFET having a shorter fin channel height (shorter FinFET) has a stacked isolation insulating layer (first 30 and second 35A isolation insulating layers) and the FinFET having a taller fin channel height (taller FinFET) has the first isolation insulating layer 30 without the second isolation insulating layer 35.

Figure 11B:
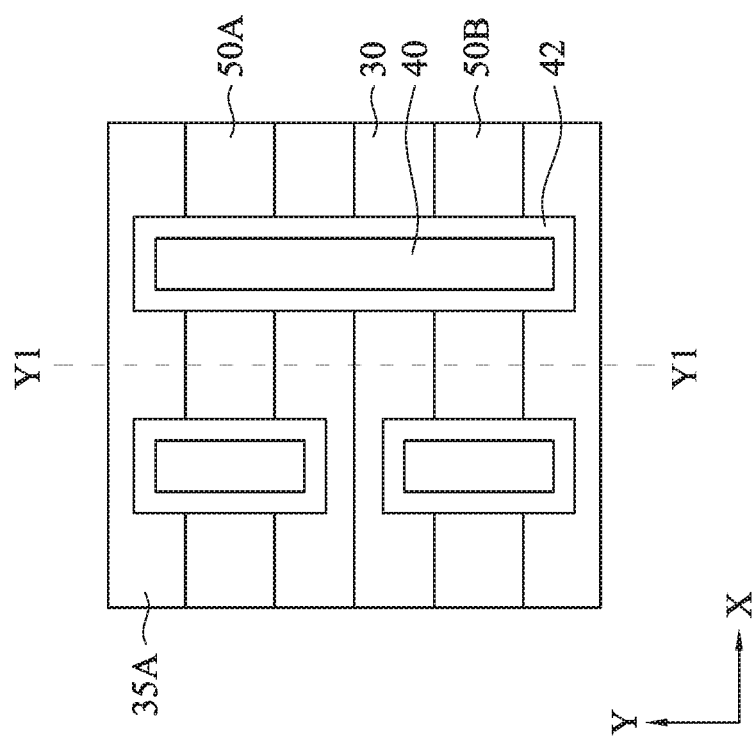
FIGS. 11A and 11B show one of the various stages of sequential processes for manufacturing a semiconductor device having FinFETs with different fin channel heights according to an embodiment of the present disclosure.
Figure 11A:
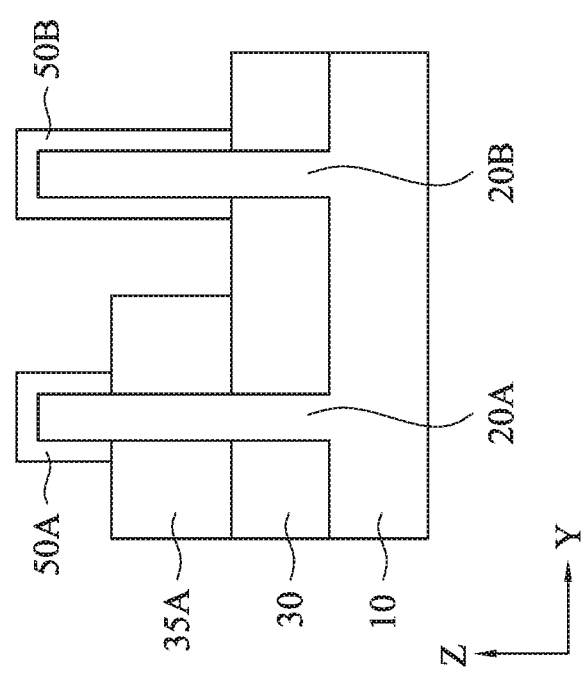

FIGS. 11A and 11B show one of the various stages of sequential processes for manufacturing a semiconductor device having FinFETs with different fin channel heights according to an embodiment of the present disclosure. FIG. 11A is a cross sectional view corresponding to line Y1-Y1 of FIG. 11B.

As shown in FIGS. 11A and 11B, source/drain (S/D) epitaxial layers 50A and 50B are formed over the exposed fin structures 20A and 20B, respectively. The S/D epitaxial layers 50A and 50B include one or more layers of Si, SiP, SiC and/or SiCP for an n-channel FET or SiGe, SiGeB and/or Ge for a p-channel FET. Group III-V semiconductor material can be used as the S/D epitaxial layers. The S/D layers 50A and 50B are selectively formed on the exposed fin structures (semiconductor layers) by an epitaxial growth method using CVD, ALD, molecular beam epitaxy (MBE) or other suitable methods.

FIGS. 12A and 12B show one of the various stages of sequential processes for manufacturing a semiconductor device having FinFETs with different fin channel heights according to an embodiment of the present disclosure. FIG. 12A is a cross sectional view corresponding to line Y2-Y2 of FIG. 12B.

Subsequently, an interlayer dielectric (ILD) layer 60 is formed, as shown in FIGS. 12A and 12B. The materials for the ILD layer 60 include compounds comprising Si, O, C and/or H, such as silicon oxide, SiCOH and SiOC. Organic materials, such as polymers, may be used for the ILD layer 60. After the ILD layer 60 is formed, a planarization operation, such as CMP, is performed, so that the top portions of the dummy gate electrode layers of the dummy gate structures 40 are exposed.

Figure 13B:
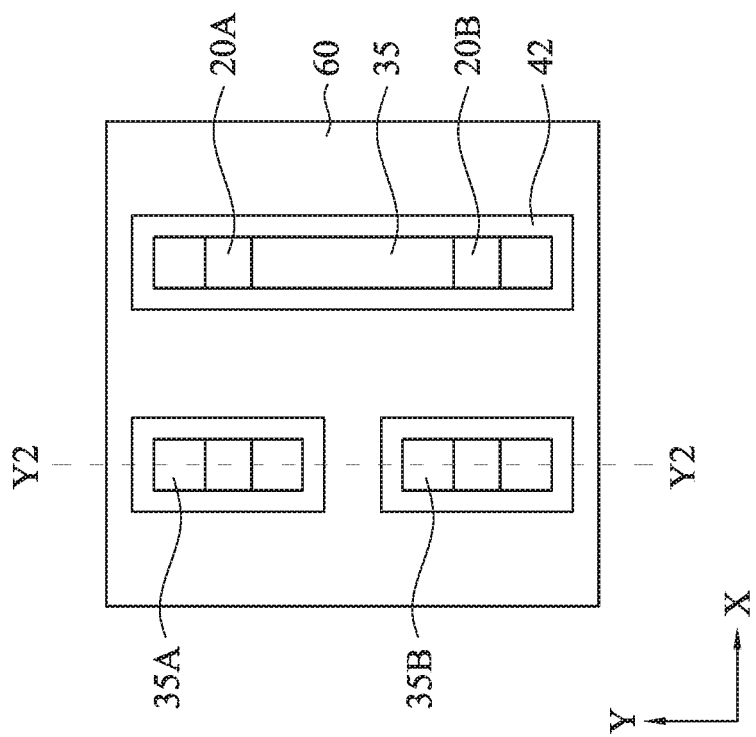
FIGS. 13A and 13B show one of the various stages of sequential processes for manufacturing a semiconductor device having FinFETs with different fin channel heights according to an embodiment of the present disclosure.
Figure 13A:
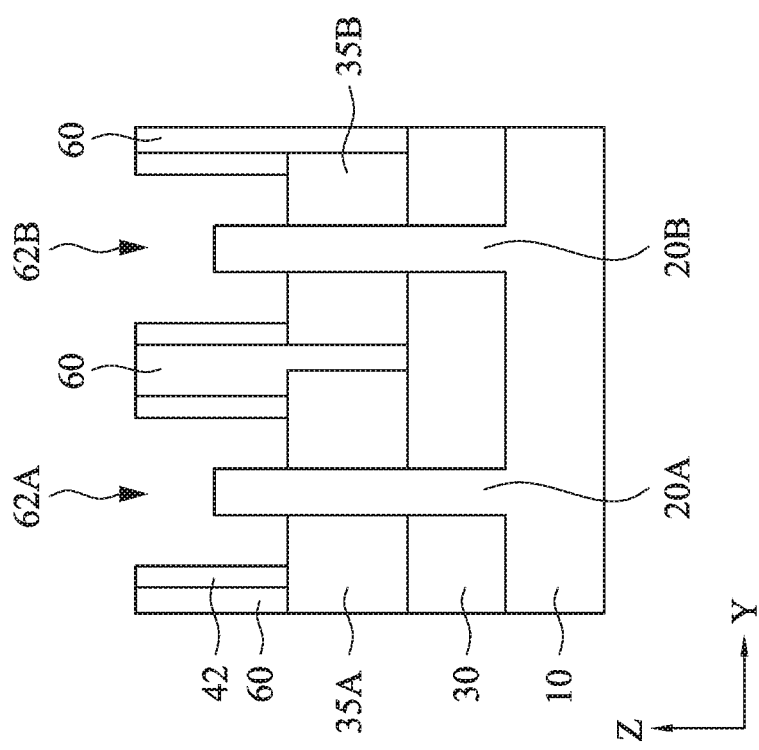

FIGS. 13A and 13B show one of the various stages of sequential processes for manufacturing a semiconductor device having FinFETs with different fin channel heights according to an embodiment of the present disclosure. FIG. 13A is a cross sectional view corresponding to line Y2-Y2 of FIG. 13B.

Next, as shown in FIGS. 13A and 13B, the dummy gate structures 40 are removed, thereby forming gate spaces 62A and 62B, in which the upper portions of the fin structures 20A and 20B are exposed, respectively. The sidewall spacers 42 are not removed.

The ILD layer 60 protects the S/D epitaxial layers 50A and 50B during the removal of the dummy gate structures 40. The dummy gate structures can be removed using plasma dry etching and/or wet etching. When the dummy gate electrode layer is polysilicon and the ILD layer 60 is silicon oxide, a wet etchant such as a TMAH solution can be used to selectively remove the dummy gate electrode layer. The dummy gate dielectric layer is thereafter removed using plasma dry etching and/or wet etching.

FIGS. 14A and 14B show one of the various stages of sequential processes for manufacturing a semiconductor device having FinFETs with different fin channel heights according to an embodiment of the present disclosure. FIG. 14A is a cross sectional view corresponding to line Y2-Y2 of FIG. 14B.

The area around the fin structure 20A, which will subsequently be the FinFET with a shorter fin channel height (shorter FinFET), is covered by a cover layer 65, as shown in FIGS. 14A and 14B. The cover layer 65 is a photo resist pattern in some embodiments.

FIGS. 15A and 15B show one of the various stages of sequential processes for manufacturing a semiconductor device having FinFETs with different fin channel heights according to an embodiment of the present disclosure. FIG. 15A is a cross sectional view corresponding to line Y2-Y2 of FIG. 15B.

Then, the second isolation insulating layer 35B in the area around the fin structure 20B, which will subsequently be the FinFET with a taller fin channel height (taller FinFET), is etched down to the upper surface of the first isolation insulating layer 30. Since the second isolation insulating layer 35B is made of a different material than the first isolation insulating layer 30, the etching substantially stops at the surface of the first isolation insulating layer 30. Further, the second isolation insulating layer 35B is made of a different material than the sidewall spacers 42 and the ILD layer 60, the second isolation layer 35B can be selectively etched.

FIGS. 16A and 16B show one of the various stages of sequential processes for manufacturing a semiconductor device having FinFETs with different fin channel heights according to an embodiment of the present disclosure. FIG. 16A is a cross sectional view corresponding to line Y2-Y2 of FIG. 16B.

After the second isolation insulating layer 35B is etched, the cover layer 65 is removed, as shown in FIGS. 16A and 16B.

Figure 17B:
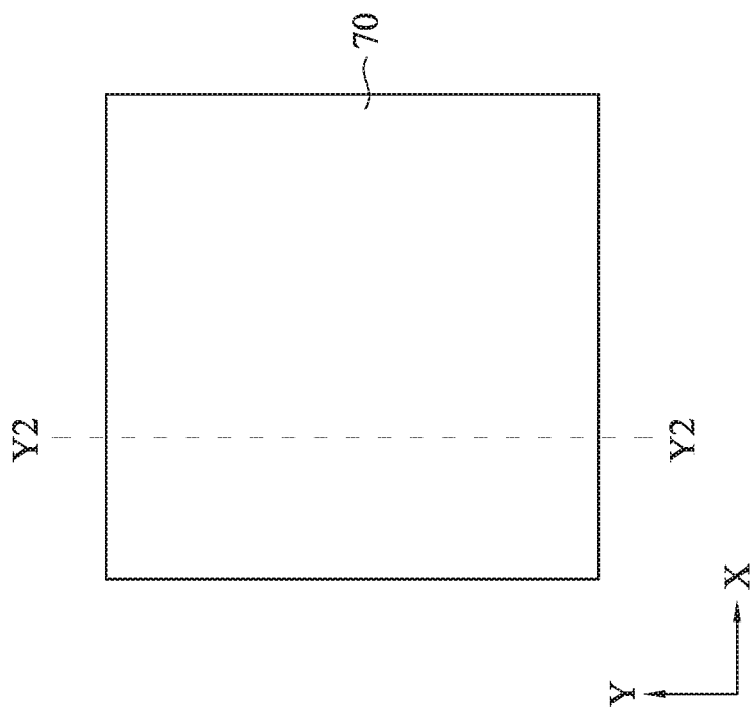
FIGS. 17A and 17B show one of the various stages of sequential processes for manufacturing a semiconductor device having FinFETs with different fin channel heights according to an embodiment of the present disclosure.
Figure 17A:
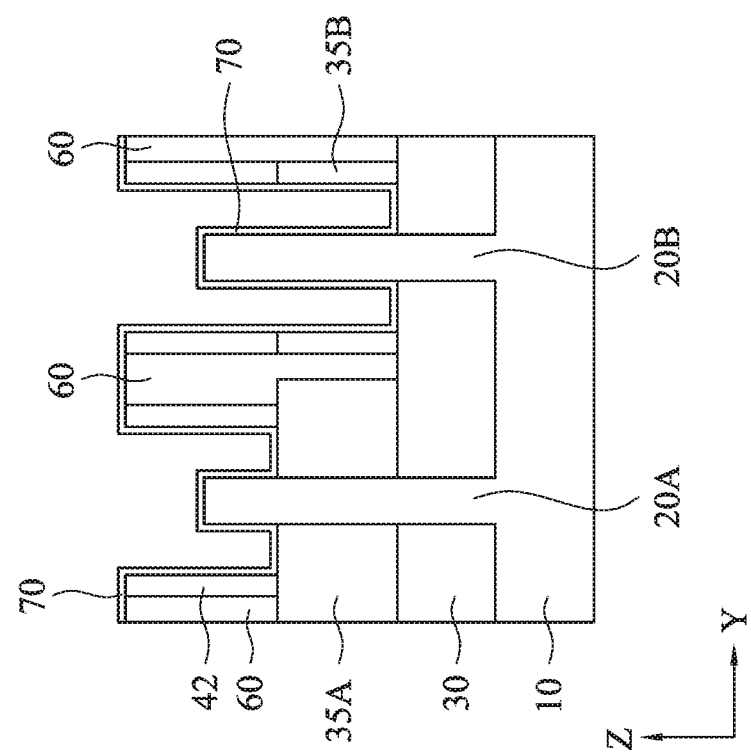

FIGS. 17A and 17B show one of the various stages of sequential processes for manufacturing a semiconductor device having FinFETs with different fin channel heights according to an embodiment of the present disclosure. FIG. 17A is a cross sectional view corresponding to line Y2-Y2 of FIG. 17B.

After the cover layer 65 is removed, a gate dielectric layer 70 is formed over the exposed fin structures (channel regions) and the surrounding areas, as shown in FIGS. 17A and 17B. In certain embodiments, the gate dielectric layer 70 includes one or more layers of a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. In some embodiments, the gate dielectric layer 70 includes an interfacial layer formed between the channel layers and the dielectric material.

The gate dielectric layer 70 may be formed by CVD, ALD or any suitable method. In one embodiment, the gate dielectric layer 70 is formed using a highly conformal deposition process such as ALD in order to ensure the formation of a gate dielectric layer having a uniform thickness around each channel layers. The thickness of the gate dielectric layer 70 is in a range from about 1 nm to about 6 nm in one embodiment.

Figure 18B:
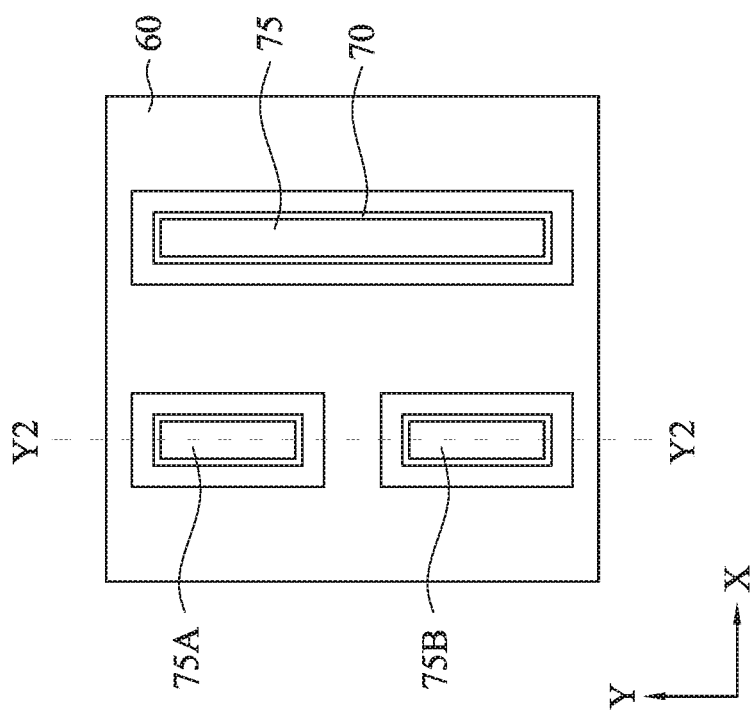
FIGS. 18A and 18B show one of the various stages of sequential processes for manufacturing a semiconductor device having FinFETs with different fin channel heights according to an embodiment of the present disclosure.
Figure 18A:
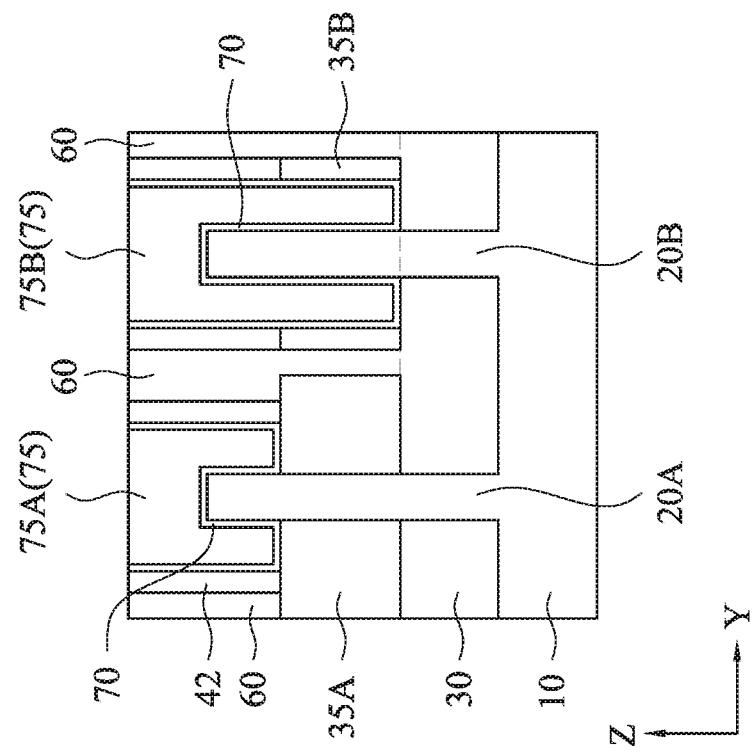

FIGS. 18A and 18B show one of the various stages of sequential processes for manufacturing a semiconductor device having FinFETs with different fin channel heights according to an embodiment of the present disclosure. FIG. 18A is a cross sectional view corresponding to line Y2-Y2 of FIG. 18B.

Subsequently, a gate electrode layer 75 is formed on the gate dielectric layer 70. The gate electrode layer 75 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof.

The gate electrode layer 75 may be formed by CVD, ALD, electro-plating, or other suitable method. The gate dielectric layer and the electrode layer are also deposited over the upper surface of the ILD layer 60. The gate dielectric layer and the gate electrode layer formed over the ILD layer 60 are then planarized by using, for example, CMP, until the top surface of the ILD layer 60 is revealed, as shown in FIG. 18A.

In certain embodiments of the present disclosure, one or more work function adjustment layers (not shown) are interposed between the gate dielectric layer 70 and the gate electrode layer 75. The work function adjustment layers are made of a conductive material such as a single layer of TiN, TaN, TaAlC, TiC, TaC, Co, Al, TiAl, HfTi, TiSi, TaSi or TiAlC, or a multilayer of two or more of these materials. For the n-channel FET, one or more of TaN, TaAlC, TiN, TiC, Co, TiAl, HfTi, TiSi and TaSi is used as the work function adjustment layer, and for the p-channel FET, one or more of TiAlC, Al, TiAl, TaN, TaAlC, TiN, TiC and Co is used as the work function adjustment layer. The work function adjustment layer may be formed by ALD, PVD, CVD, e-beam evaporation, or other suitable process. Further, the work function adjustment layer may be formed separately for the n-channel FET and the p-channel FET which may use different metal layers.

Figure 19C:
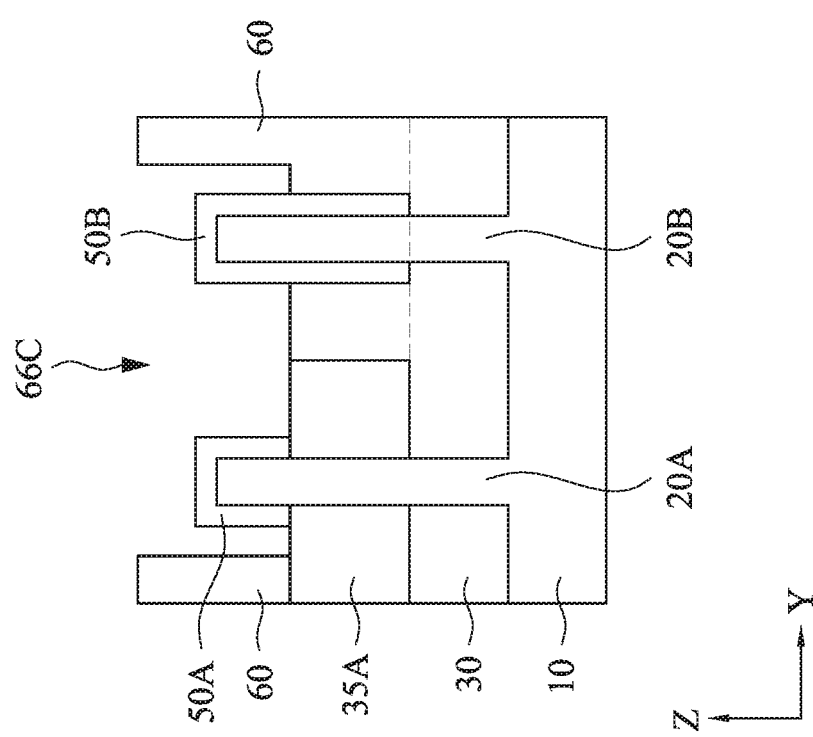

FIGS. 19A-19C show one of the various stages of sequential processes for manufacturing a semiconductor device having FinFETs with different fin channel heights according to an embodiment of the present disclosure. FIG. 19A is a cross sectional view corresponding to line Y3-Y3 of FIG. 19B and FIG. 19C is a cross sectional view corresponding to line Y1-Y1.

After the metal gate structures are formed, the ILD layer 60 is partially etched (patterned) by using lithography and etching operations, to form contact openings 66A, 66B and 66C, in which the source/drain regions 50A and/or 50B are exposed, as shown in FIG. 19A-19C. In some embodiments, as shown in FIG. 19C, a large contact opening 66C is formed to expose two source/drain regions 50A and 50B. The contact opening etching for the area around the fin structure 20A substantially stops at the surface of the second isolation insulating layer 35A.

FIGS. 20A and 20B show one of the various stages of sequential processes for manufacturing a semiconductor device having FinFETs with different fin channel heights according to an embodiment of the present disclosure. FIG. 20A is a cross sectional view corresponding to line Y3-Y3 of FIG. 20B.

In the foregoing contact opening etching, the ILD layer 60 at the area around the fin structure 20B is over-etched, in some embodiments, to expose substantially the entire part of the source/drain epitaxial layer 50B. Only a bottom part of the source/drain epitaxial layer 50B remains embedded in the ILD layer 60. The embedded amount is about 5 nm to about 20 nm in some embodiments.

Figure 21D:
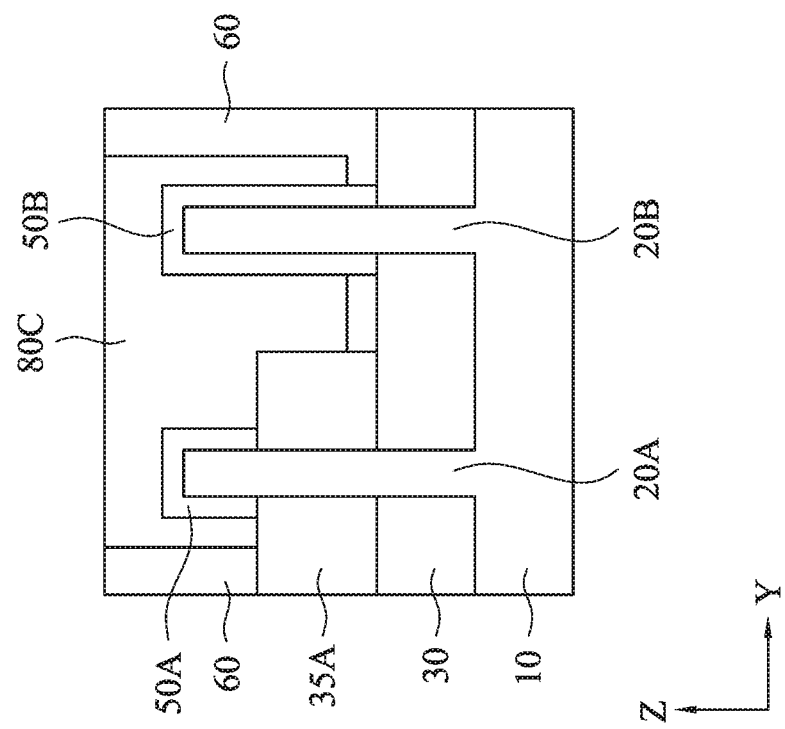
Figure 21C:
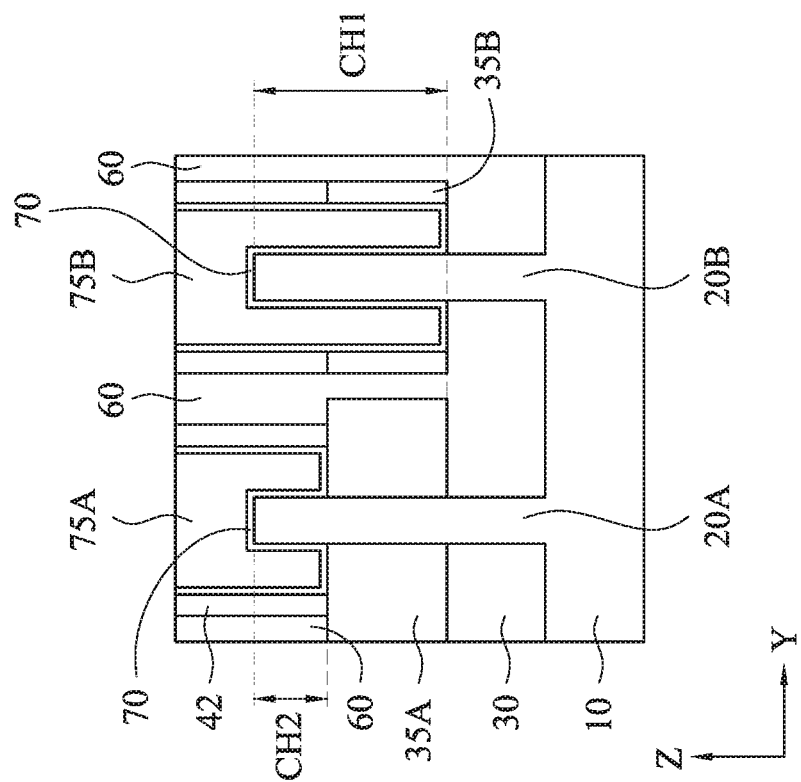

FIGS. 21A-21D show one of the various stages of sequential processes for manufacturing a semiconductor device having FinFETs with different fin channel heights according to an embodiment of the present disclosure. FIG. 21A is a cross sectional view corresponding to line Y3-Y3 of FIG. 21B, FIG. 21C is a cross sectional view corresponding to line Y2-Y2 of FIG. 21B, and FIG. 21D is a cross sectional view corresponding to line Y1-Y1 of FIG. 21B.

In the contact openings, a conductive material is formed. The conductive material is formed in and over the contact openings and then a planarization operation, such as a CMP operation, is performed to form contacts 80A, 80B and 80C, as shown in FIGS. 21A, 21B and 21D. The conductive material includes one or more layers of Co, Ni, W, Ti, Ta, Cu, Al, TiN and TaN, or any other suitable material. In some embodiments, a silicide layer is formed over the S/D epitaxial layers 50A and 50B before forming the conductive material. The silicide layer includes one or more of WSi, CoSi, NiSi, TiSi, MoSi and TaSi.

As shown in FIG. 21C, the shorter FinFET formed by the fin structure 20A has a shorter fin channel height than the taller FinFET formed by the fin structure 20B. The fin channel height CH1 of the taller FinFETs is measured from the interface between the gate dielectric layer 70 and the first isolation insulating layer 30 (i.e., the upper surface of the first isolation insulating layer 30) to the top of the fin structure 20B, and the fin channel height CH2 of the shorter FinFET is measured from the interface between the gate dielectric layer 70 and the second isolation insulating layer 35A (i.e., the upper surface of the second isolation insulating layer 35A) to the top of the fin structure 20A. The fin channel height of the taller FinFET is 1.5 to 3 times the fin channel height of the shorter FinFET in some embodiments.

The taller FinFET includes lower sidewall spacers formed by a part of the second isolation insulating layer 35B disposed over opposing side faces of the gate electrode layer 75B, and upper sidewall spacers 42 vertically disposed on the lower sidewall spacers 35B. The shorter FinFET includes only sidewall spacers 42 disposed over opposing side faces of the gate electrode layer 75A, and does not have sidewall spacers formed by a part of the second isolation insulating layer 35. A top of the fin structure 20A and a top of the fin structure 20B are located at substantially the same height (the difference is less than about 1.0 nm). Further, in some embodiments, a width of the fin structure 20A is substantially equal to a width of the fin structure 20B (the difference is less than about 0.5 nm), and in other embodiments, the width of the fin structure 20A is greater or smaller than the width of the fin structure 20B.

It is understood that the FinFETs undergo further CMOS processes to form various features such as contacts/vias, interconnect metal layers, dielectric layers, passivation layers, etc.

FIGS. 22A-25B show sequential processes for manufacturing a semiconductor device having FinFETs with different fin channel heights according to another embodiment of the present disclosure. It is understood that additional operations can be provided before, during, and after processes shown by FIGS. 22A-25B, and some of the operations described below can be replaced or eliminated, for additional embodiments of the method. The order of the operations/processes may be interchangeable. Material, configuration, dimensions and/or processes the same as or similar to the foregoing embodiments described with respect to FIGS. 1A-22D may be employed in the following embodiments, and detailed explanation thereof may be omitted. In FIGS. 22A-25B, the "A" figures (FIG. 22A, 23A, . . . ) show cross sectional views along the Y direction corresponding to Y2-Y2 of the "B" figures (FIGS. 22B, 23B, . . . ) showing plan views (top views).

After the structure of FIGS. 4A and 4B are formed, by using lithography and etching operations, the second isolation insulating layer 35 is partially etched in the area for the taller FinFET, as shown in FIGS. 22A and 22B. Etching of the second isolation insulating layer 35 can substantially stop at the first isolation insulating layer 30.

Figure 23B:
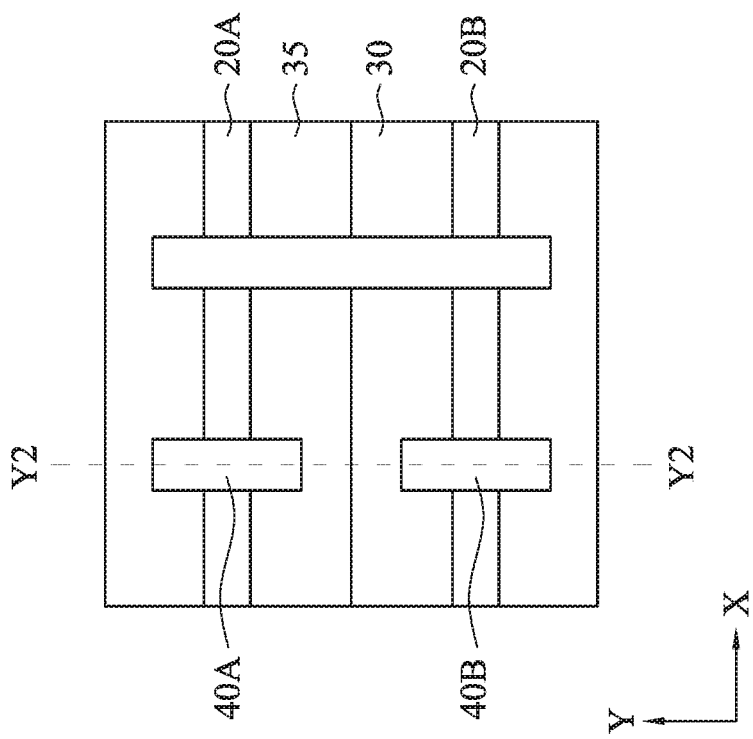
FIGS. 23A and 23B show one of the various stages of sequential processes for manufacturing a semiconductor device having FinFETs with different fin channel heights according to another embodiment of the present disclosure.
Figure 23A:
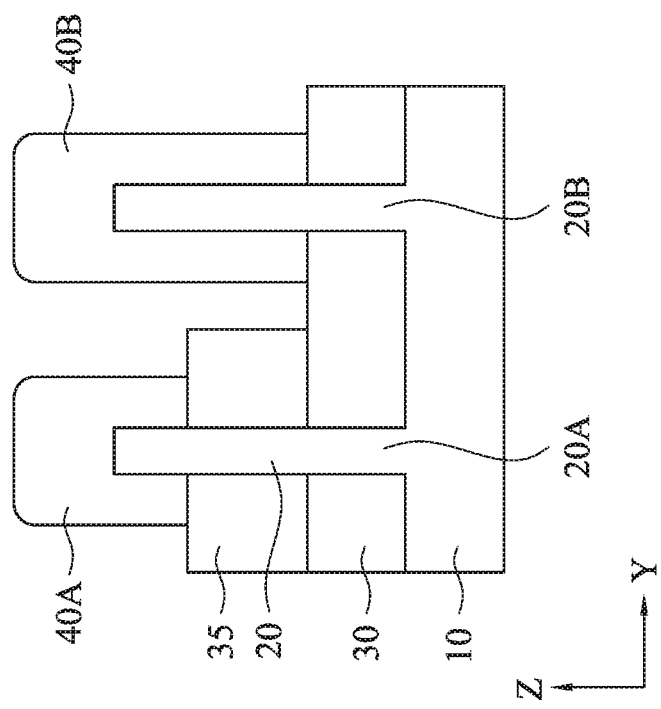

Similar to FIGS. 6A and 6B, after the second isolation insulating layer 35 is etched, a dummy gate structure 40 is formed, as shown in FIGS. 23A and 23B.

Figure 24B:
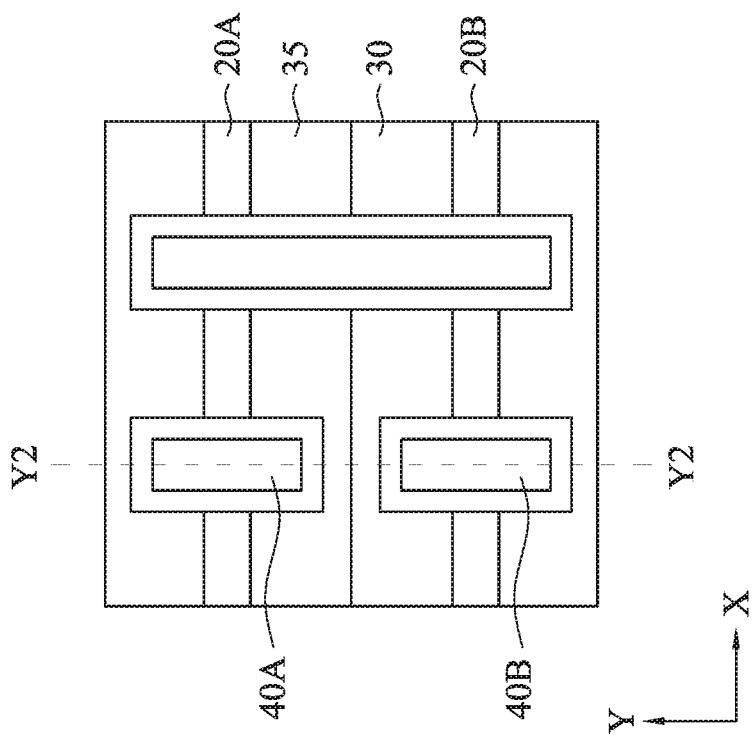
FIGS. 24A and 24B show one of the various stages of sequential processes for manufacturing a semiconductor device having FinFETs with different fin channel heights according to another embodiment of the present disclosure.
Figure 24A:
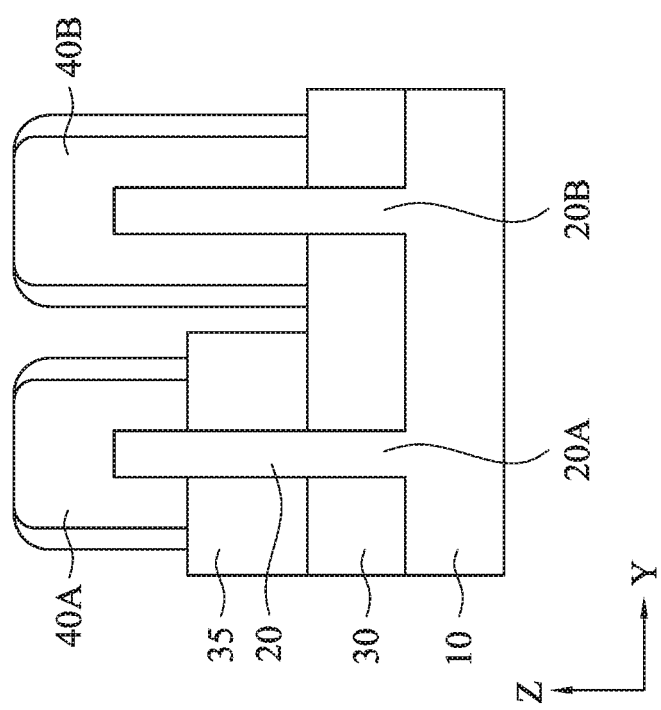

Then, similar to FIGS. 7A and 7B, the sidewall spacers 42 are formed on opposite sidewalls of the dummy gate structures 40, as shown in FIGS. 24A and 24B.

Subsequently, the ILD layer 60 is formed, the dummy gate electrode layers 40 are removed, and then the metal gate structures are formed, as shown in FIGS. 25A and 25B. In this embodiment, the taller FinFET has sidewall spacers 42 continuously formed in the vertical direction.

FIGS. 26A-28B show sequential processes for manufacturing a semiconductor device having FinFETs with different fin channel heights according to another embodiment of the present disclosure. It is understood that additional operations can be provided before, during, and after processes shown by FIGS. 26A-28B, and some of the operations described below can be replaced or eliminated, for additional embodiments of the method. The order of the operations/processes may be interchangeable. Material, configuration, dimensions and/or processes the same as or similar to the foregoing embodiments described with respect to FIGS. 1A-25B may be employed in the following embodiments, and detailed explanation thereof may be omitted. In FIGS. 26A-28B, the "A" figures (FIG. 26A, 27A, ... ) show cross sectional views along the Y direction corresponding to Y3-Y3 of the "B" figures (FIGS. 26B, 27B, ... ) showing plan views (top views).

Figure 26B:
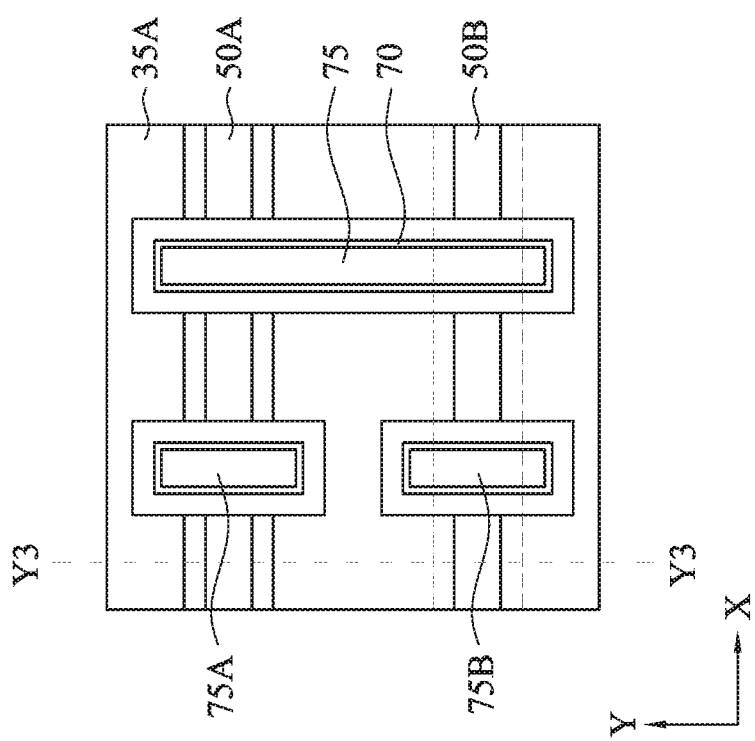
FIGS. 26A and 26B show one of the various stages of sequential processes for manufacturing a semiconductor device having FinFETs with different fin channel heights according to another embodiment of the present disclosure.
Figure 26A:
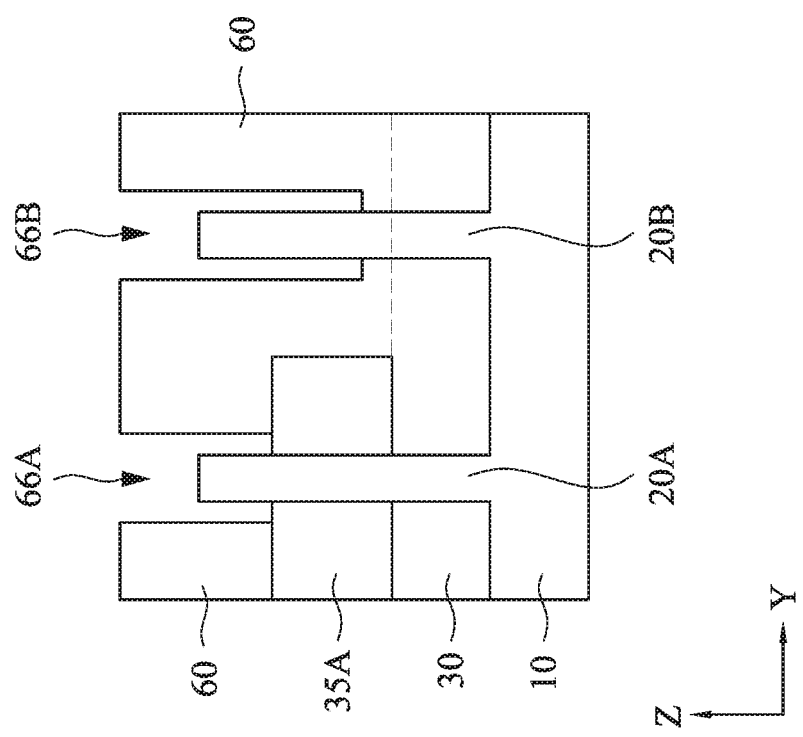

In this embodiment, unlike FIGS. 11A and 11B, source/drain epitaxial layers are not formed at this stage of the manufacturing operation after the second isolation insulating layer is etched. After the metal gate structures are formed, the contact opening 66A and 66B are formed as shown in FIGS. 26A and 26B.

Figure 27B:
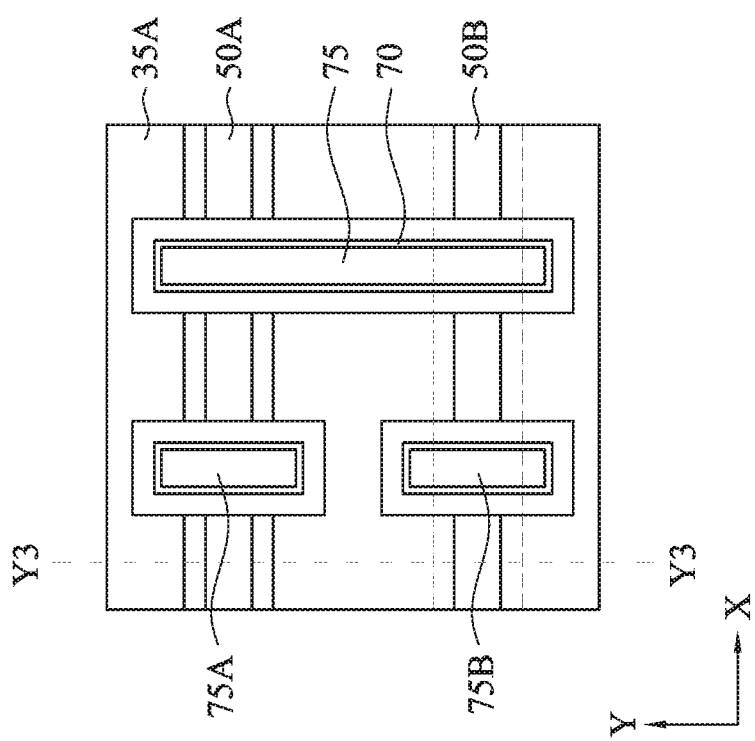
FIGS. 27A and 27B show one of the various stages of sequential processes for manufacturing a semiconductor device having FinFETs with different fin channel heights according to another embodiment of the present disclosure.
Figure 27A:
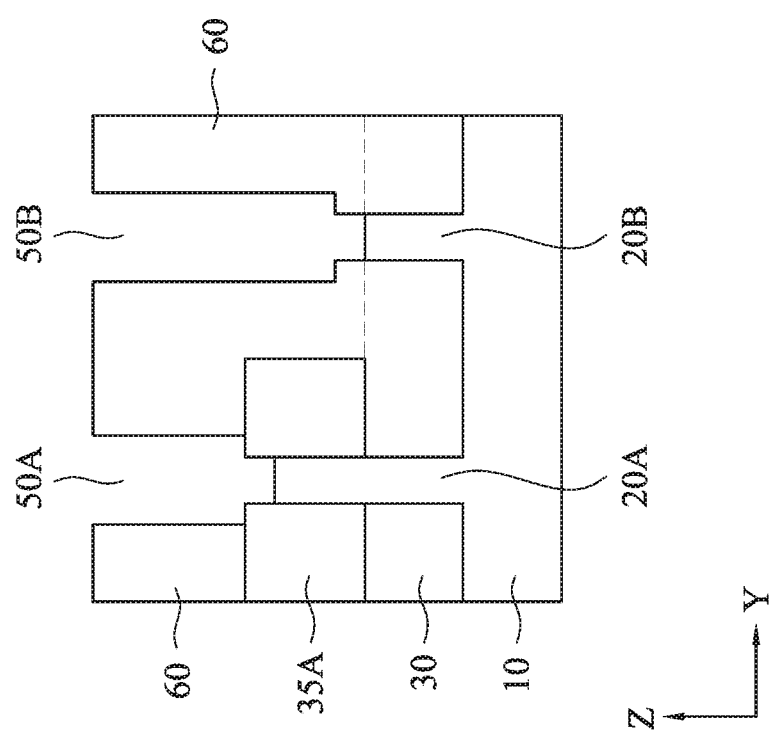

Then, as shown in FIGS. 27A and 27B, the exposed fin structures 20A and 20B are recessed down at or below the upper surface of the second isolation insulating layer 35A or the first isolation insulating layer 30.

Figure 28B:
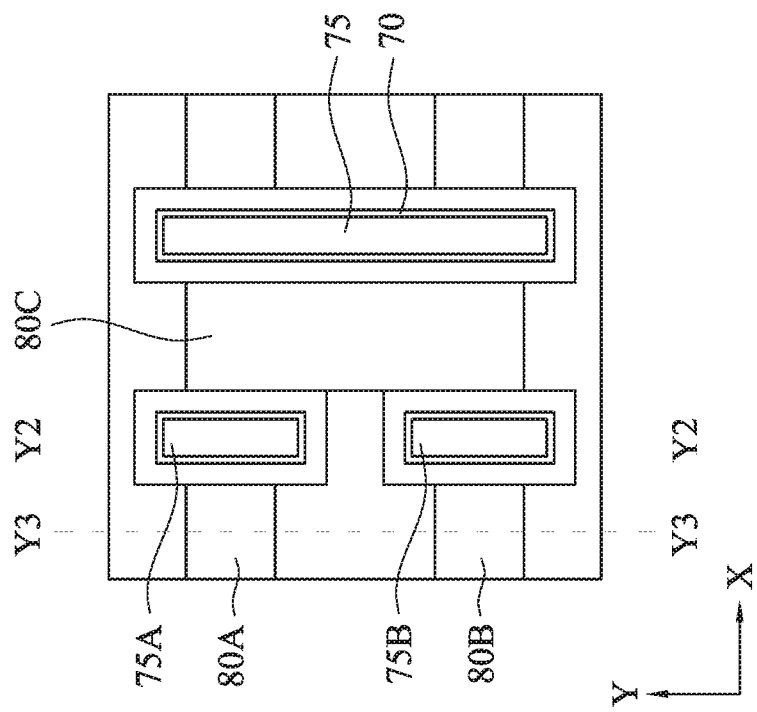
FIGS. 28A and 28B show one of the various stages of sequential processes for manufacturing a semiconductor device having FinFETs with different fin channel heights according to another embodiment of the present disclosure.
Figure 28A:
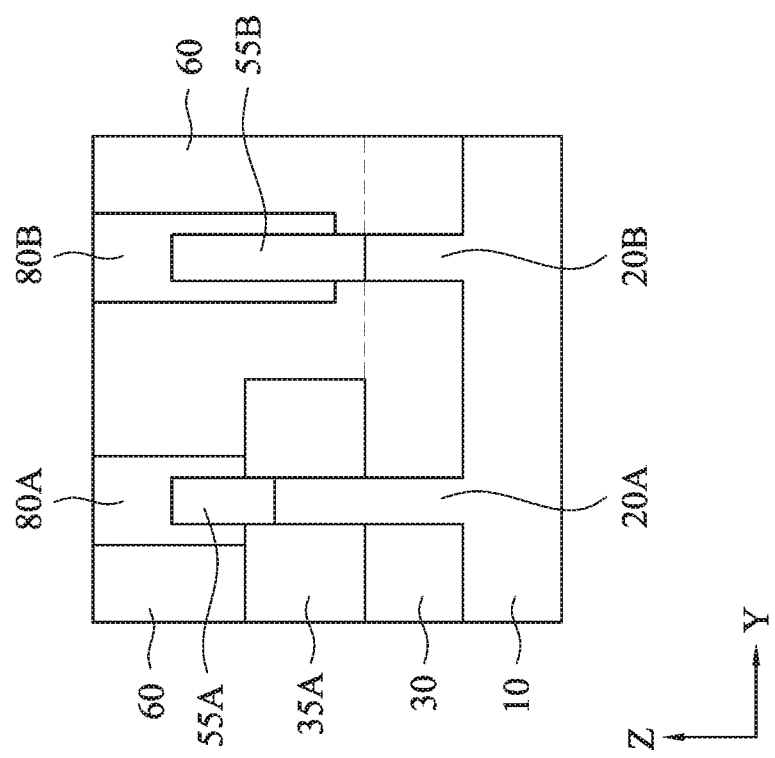

Next, epitaxial layers 55A and 55B are formed over the recessed fin structures 20A and 20B, and then conductive contact layers 80A, 80B and 80C are formed as shown in FIGS. 28A and 28B. The epitaxial layers 55A and 55B include one or more layers of Si, SiP, SiC and/or SiCP for an n-channel FET or SiGe, SiGeB and/or Ge for a p-channel FET. Group III-V semiconductor material can be used as the S/D epitaxial layers.

Figure 29A:
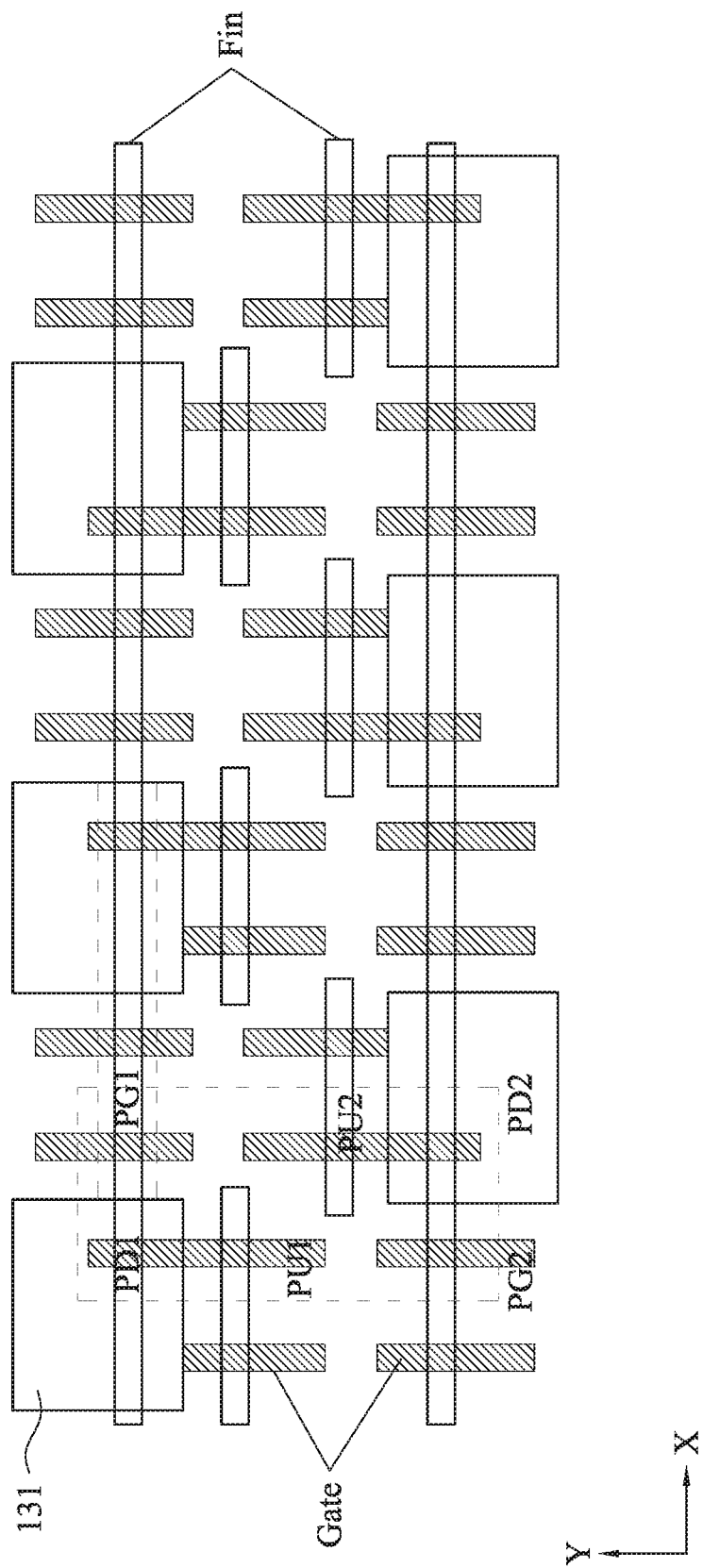
FIGS. 29A and 29B show an SRAM having FinFETs with different fin channel heights according to an embodiment of the present disclosure.
Figure 29B:
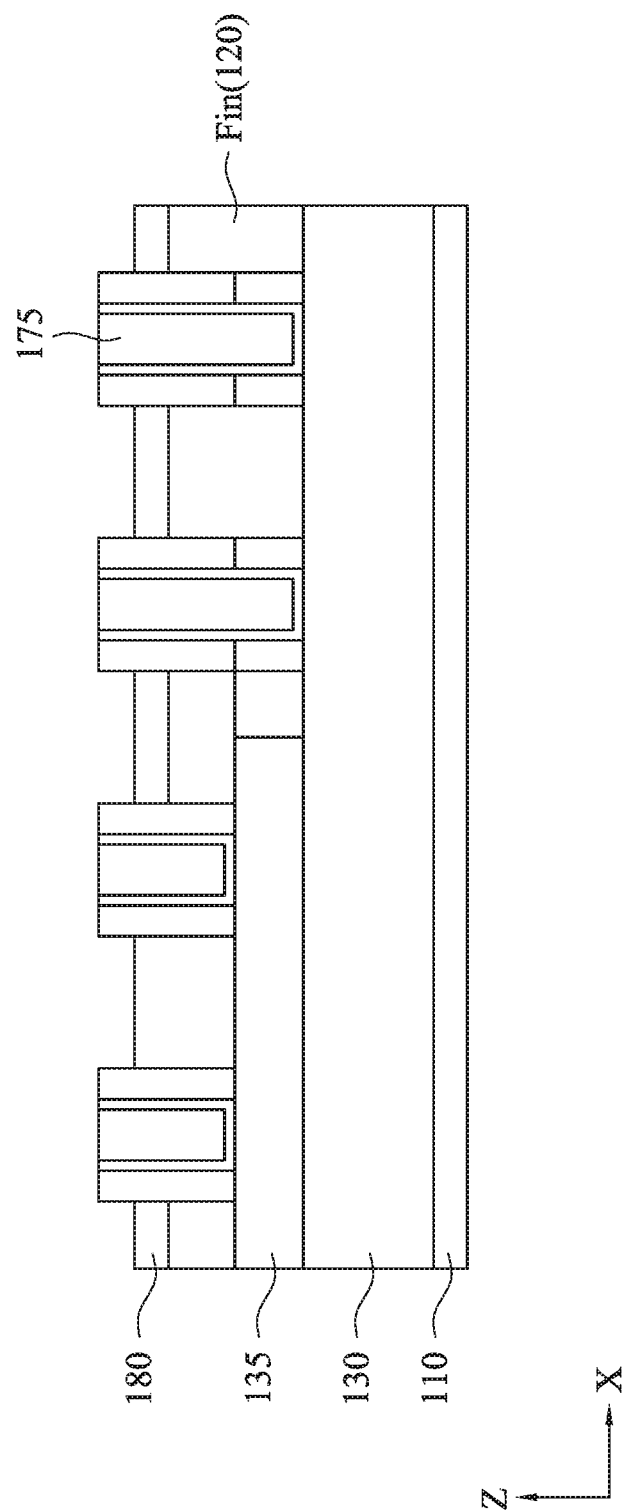
Figure 30:
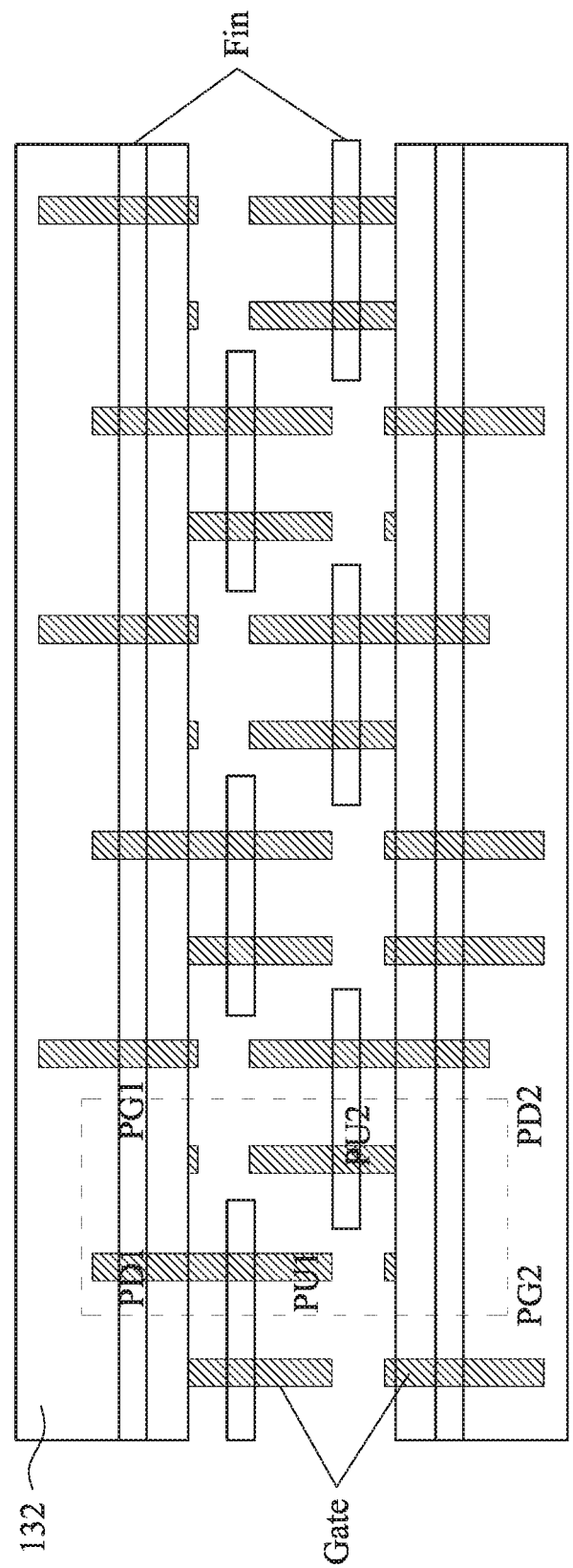
FIG. 30 shows an SRAM having FinFETs with different fin channel heights according to another embodiment of the present disclosure.

FIGS. 29A and 29B show a semiconductor device (SRAM) having FinFETs with different fin channel heights according to an embodiment of the present disclosure. FIG. 30 shows a semiconductor device (SRAM) having FinFETs with different fin channel heights according to another embodiment of the present disclosure. Material, configuration, dimensions and/or processes the same as or similar to the foregoing embodiments described with respect to FIGS. 1A-27B may be employed in the following embodiments, and detailed explanation thereof may be omitted.

As shown in FIG. 29A, a static random access memory (SRAM) cell includes a first pull-up transistor PU1, a first pull-down transistor PD1, and a first pass-gate transistor PG1. Drain electrodes of the first pull-up transistor PU1, the first pull-down transistor PD1, and the first pass-gate transistor PG1 are electrically connected at a first data storage node. The SRAM cell further includes a second pull-up transistor PU2, a second pull-down transistor PD2, and a second pass-gate transistor PG2. Drain electrodes of the second pull-up transistor PU2, the second pull-down transistor PD2, and the second pass-gate transistor PG2 are electrically connected at a second data storage node. Gate electrode layers of the second pull-up transistor PU2 and the second pull-down transistor PD2 are electrically connected to the drain electrodes of the first pull-down transistor PD1, the first pass-gate transistor PG1 and the first pull-up transistor PU1 through the first data storage node. Gate electrode layers of the first pull-up transistor PU1 and the first pull-down transistor PD1 are electrically connected to the drain electrodes of the second pull-down transistor PD2, the second pass-gate transistor PG2 and the second pull-up transistor PU2 through the second data storage node. Source electrodes of the first and second pull-up transistors PU1 and PU2 are connected to a first power supply node (e.g., Vdd), while source electrodes of the first and second pull-down transistors PD1 and PD2 are connected to a second power supply node (e.g., $V_{SS}$). According to some embodiments, in the SRAM cell, the first and second pass-gate transistors PG1 and PG2 and the first and second pull-down transistors PD1 and PD2 are N-type transistors, and the first and second pull-up transistors PU1 and PU2 are P-type transistors.

In the present embodiments, all of the transistors in the SRAM cell are formed by a FinFET, respectively.

In an embodiment of the present disclosure, the pull-down transistors PD1 and PD2 are formed by a taller FinFET, respectively, while the rest of transistors are formed by a shorter FinFET, respectively. FIG. 29B shows a cross section corresponding to the area surrounded by a broken line of FIG. 29A. In the cross section, a first isolation insulating layer 130 are formed over a substrate 110 and a second isolation insulating layer 135 is partially disposed over the first isolation insulating layer, similar to the embodiments of FIGS. 1A-28B. Fin structures 120 having portions with different channel height (exposed portions) are disposed along the X direction, and metal gate structures 175 are disposed over the fin structures 120 and extend in the Y direction. The epitaxial layer 180 is also formed over the fin structures 120. In the taller FinFETs (PD1, PD2), the metal gate structures are sandwiched by lower sidewall spacers and upper sidewall spacers similar to the embodiments of FIGS. 1A-21D and 26A-28B. In FIG. 29, the areas 131 show portions where the second isolation insulating layer is etched for the taller FinFETs.

Similarly, in FIG. 30, in addition to the pull-down transistors PD1 and PD2, pass-gate transistors PG1 and PG2 are formed by a taller FinFET, respectively. The areas 132 show portions where the second isolation insulating layer is etched for the taller FinFETs.

By selectively using taller FinFETs and shorter FinFETs, it is possible to improve performance of an SRAM device.

The various embodiments or examples described herein offer several advantages over the existing art. For example, in the present disclosure, selectively using a taller FinFET and a shorter FinFET, it is possible to improve performance, for example, speed and power consumption, of a semiconductor device. Further, by utilizing a second isolation insulating layer made of a different material than a first isolation insulating layer and sidewall spacers of a dummy gate structure, it is possible to fabricate the taller FinFET and shorter FinFET without process difficulties.

It will be understood that not all advantages have been necessarily discussed herein, no particular advantage is required for all embodiments or examples, and other embodiments or examples may offer different advantages.

In accordance with one aspect of the present disclosure, in a method of manufacturing a semiconductor device, a fin structure protruding from a first isolation insulating layer disposed over a substrate is formed. A second isolation insulating layer made of different material than the first isolation insulating layer is formed so that a first upper portion of the fin structure is exposed. A dummy gate structure is formed over the exposed first upper portion of the first fin structure. The second isolation insulating layer is etched by using the dummy gate structure as an etching mask. The dummy gate structure is removed so that a gate space is formed. The second isolation insulating layer is etched in the gate space so that a second upper portion of the fin structure is exposed from the first isolation insulating layer. A gate dielectric layer is formed over the exposed second portion of the fin structure, and a gate electrode layer over the gate dielectric layer is formed. In one or more of the foregoing or following embodiments, the second isolation insulating layer is made of at least one of SiCO and SiCON. In one or more of the foregoing or following embodiments, a height of the second upper portion is 1.5 to 3 times a height of the first upper portion. In one or more of the foregoing or following embodiments, after the dummy gate structure is formed, sidewall spacers are formed on opposing sides of the dummy gate structure, and the sidewall spacers are made of different material than the first and second isolation insulating layers. In one or more of the foregoing or following embodiments, side faces of the gate electrode layer are covered by the sidewall spacers and the second isolation insulating layer via the gate dielectric layer. In one or more of the foregoing or following embodiments, after the second isolation insulating layer is etched by using the dummy gate structure as an etching mask, a portion of the fin structure to be a source region or a drain region is exposed. In one or more of the foregoing or following embodiments, in the method, an epitaxial layer is formed over the exposed portion of the fin structure, and a first interlayer dielectric layer is formed over the epitaxial layer. In one or more of the foregoing or following embodiments, in the method, an upper portion of the first interlayer dielectric layer is etched, thereby forming a contact opening in which an upper part of the epitaxial layer is exposed, and a conductive material is formed in the contact opening.

In accordance with another aspect of the present disclosure, in a method of manufacturing a semiconductor device, a first fin structure and a second fin structure are formed, both of which protrude from a first isolation insulating layer disposed over a substrate. A second isolation insulating layer made of different material than the first isolation insulating layer is formed so that a first upper portion of the first fin structure and a first upper portion of the second fin structure are exposed. A first dummy gate structure is formed over the exposed first upper portion of the first fin structure and a second dummy gate structure is formed over the exposed first upper portion of the second fin structure. The second isolation insulating layer is etched by using the first dummy gate structure as an etching mask, while the second dummy gate structure and a surrounding area are covered by a first cover layer. The first dummy gate structure is removed so that a first gate space is formed and the second dummy gate structure is removed so that a second gate space is formed. The second isolation insulating layer is etched in the first gate space so that a second upper portion of the first fin structure is exposed from the first isolation insulating layer, while the second gate opening and a surrounding area are covered by a second cover layer. A gate dielectric layer is formed over the exposed second portion of the first fin structure and an upper portion of the second fin structure. A first gate electrode layer is formed on the gate dielectric layer over the first fin structure, and a second gate electrode layer is formed on the gate dielectric layer over the second fin structure. In one or more of the foregoing or following embodiments, the first cover layer is a photoresist pattern and removed after the second isolation insulating layer is etched by using the first dummy gate structure as an etching mask, and the second cover layer is a photo resist pattern and removed after the second isolation insulating layer is etched in the first gate space. In one or more of the foregoing or following embodiments, the second isolation insulating layer is made of at least one of SiCO and SiCON. In one or more of the foregoing or following embodiments, the first fin structure is for a first fin field effect transistor (FinFET) and the second fin structure is for a second FinFET, and a height of a fin channel of the first FinFET is 1.5 to 3 times a height of a fin channel of the second FinFET. In one or more of the foregoing or following embodiments, after the first and second dummy gate structures are formed, first sidewall spacers are formed on opposing sides of the first dummy gate structure and second sidewall spacers are formed on opposing sides of the second dummy gate structure, and the first and second sidewall spacers are made of different material than the first and second isolation insulating layers. In one or more of the foregoing or following embodiments, side faces of the first gate electrode layer are covered by the first sidewall spacers and the second isolation insulating layer via the gate dielectric layer, and side faces of the second gate electrode layer are covered by the second sidewall spacers via the gate dielectric layer but not covered by the second isolation insulating layer. In one or more of the foregoing or following embodiments, after the second isolation insulating layer is etched by using the first dummy gate structure as an etching mask, a portion of the first fin structure to be a source region or a drain region is exposed, and a portion of the second fin structure to be a source region or a drain region is exposed. In one or more of the foregoing or following embodiments, in the method, a first epitaxial layer is formed over the exposed portions of the first fin structure and a second epitaxial layer is formed over the exposed portions of the second fin structure, and a first interlayer dielectric layer is formed over the first and second epitaxial layers. In one or more of the foregoing or following embodiments, in the method, an upper portion of the first interlayer dielectric layer is etched, thereby forming a first contact opening in which an upper part of the first epitaxial layer is exposed and forming a second contact opening in which an upper part of the second epitaxial layer is exposed. A portion of the first interlayer dielectric layer is further etched in the first contact opening, thereby exposing a lower portion of the first epitaxial layer. A first conductive material is formed in the first contact opening to cover the lower portion of the first epitaxial layer and a second conductive material is formed in the second contact opening.

According to another aspect of the present disclosure, in a method of manufacturing a semiconductor device, a first fin structure is formed in a first region and a second fin structure is formed in a second region, both of which protrude from a first isolation insulating layer disposed over a substrate. A second isolation insulating layer made of different material than the first isolation insulating layer is formed so that a first upper portion of the first fin structure and a first upper portion having source/drain region of the second fin structure are exposed. The second isolation insulating layer is etched in the first region to exposed source/drain regions of the first fin structure, while covering the second region. A first epitaxial layer is formed over the exposed source/drain regions of the first fin structure, and a second epitaxial layer is formed over the source/drain regions of the first upper portion of the second fin structure. In one or more of the foregoing or following embodiments, the first fin structure is for a first fin field effect transistor (FinFET) and the second fin structure is for a second FinFET, and a height of the source/drain region of the first FinFET is 1.5 to 3 times a height of the source/drain region of the second FinFET. In one or more of the foregoing or following embodiments, the second isolation insulating layer is made of SiCO.

In accordance with one aspect of the present disclosure, a semiconductor device includes a fin structure protruding from an isolation insulating layer provided over a substrate, a gate dielectric layer disposed over a channel region of the fin structure, a gate electrode layer disposed over the gate dielectric layer, and sidewall spacers disposed over opposing side faces of the gate electrode layer. The sidewall spacers includes lower sidewall spacers and upper sidewall spacers vertically disposed on the lower sidewall spacers, and the lower sidewall spacers are made of a different insulating material than the isolation insulating layer. In one or more of the foregoing or following embodiments, the lower sidewall spacers are made of a different insulating material than the upper sidewall spacer layers. In one or more of the foregoing or following embodiments, the isolation insulating layer is made of a different insulating material than the upper sidewall spacer layers. In one or more of the foregoing or following embodiments, the lower sidewall spacers are made of at least one of SiCO and SiCON. In one or more of the foregoing or following embodiments, the gate dielectric layer is disposed between the sidewall spacers and the gate electrode layer.

In accordance with another aspect of the present disclosure, a semiconductor device includes a first fin field effect transistor (FinFET), and a second FinFET. A fin channel height of the first FinFET is greater than a fin channel height of the second FinFET. In one or more of the foregoing or following embodiments, the first FinFET includes a first fin structure protruding from a first isolation insulating layer provided over a substrate, a first gate dielectric layer disposed over a first channel region of the fin structure, and a first gate electrode layer disposed over the gate dielectric layer. The second FinFET includes a second fin structure protruding from a second isolation insulating layer disposed over the isolation insulating layer, a second gate dielectric layer disposed over a second channel region of the fin structure, and a second gate electrode layer disposed over the gate dielectric layer. The fin channel height of the first FinFET is measured from an interface between the first gate dielectric layer and the first isolation insulating layer, and the fin channel height of the second FinFET is measured from an interface between the second gate dielectric layer and the second isolation insulating layer. In one or more of the foregoing or following embodiments, the first FinFET further includes first sidewall spacers disposed over opposing side faces of the gate electrode layer, the first sidewall spacers including lower sidewall spacers and upper sidewall spacers vertically disposed on the lower sidewall spacers. The second FinFET further includes second sidewall spacers disposed over opposing side faces of the gate electrode layer. The second sidewall spacers are made of a same material as the upper sidewall spacers, and the second FinFET includes no lower sidewall spacers vertically disposed. In one or more of the foregoing or following embodiments, the lower sidewall spacers are made of a different insulating material than the first isolation insulating layer, and the lower sidewall spacers are made of a same material as the second isolation insulating layer. In one or more of the foregoing or following embodiments, the lower sidewall spacers and the second isolation insulating layer are made of at least one of SiCO and SiCON. In one or more of the foregoing or following embodiments, the upper sidewall spacers and the second sidewall spacers are made at least one of SiN and SiON. In one or more of the foregoing or following embodiments, a top of the first fin structure and a top of the second fin structure are located at a same height. In one or more of the foregoing or following embodiments, a width of the first fin structure is equal to a width of the second fin structure. In one or more of the foregoing or following embodiments, the first gate dielectric layer is disposed between the lower and upper sidewall spacers and the first gate electrode layer. In one or more of the foregoing or following embodiments, the first FinFET further includes a first source/drain epitaxial layer disposed on a source/drain region of the first fin structure. The second FinFET further includes a second source/drain epitaxial layer disposed on a source/drain region of the second fin structure. The second isolation insulating layer is disposed between the second source/drain epitaxial layer and the first isolation insulating layer along a vertical direction. In one or more of the foregoing or following embodiments, the first source/drain epitaxial layer is in contact with the first isolation insulating layer, and the second source/drain epitaxial layer is in contact with the second isolation insulating layer. In one or more of the foregoing or following embodiments, the fin channel height of the first FinFET is 1.5 to 3 times the fin channel height of the second FinFET.

In accordance with another aspect of the present disclosure, a semiconductor static random access memory (SRAM) includes a first pass-gate transistor, a second pass-gate transistor, a first pull-up transistor, a second pull-up transistor, a first pull-down transistor and a second pull-down transistor, each of which is formed by a fin field effect transistor. A fin channel height of the FinFET of the first and second pull-down transistors is greater than at least one of a fin channel height of the FinFET of the first and second pass-gate transistors and a fin channel height of the FinFET of the first and second pull-up transistors. In one or more of the foregoing or following embodiments, the SRAM further includes a first isolation insulating layer and a second isolation insulating layer disposed over a part of the first isolation insulating layer. The first and second pull-down transistors are disposed at an area where no second isolation insulating layer is disposed, and the first and second pull-up transistors are disposed at an area where the second isolation insulating layer is disposed over the first isolation insulating layer. In one or more of the foregoing or following embodiments, the first and second pass-gate transistors are disposed at the area where the second isolation insulating layer is disposed over the first isolation insulating layer.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor device, comprising:
a first fin structure and a second fin structure, both protruding from an isolation insulating layer provided over a substrate;
a gate dielectric layer disposed over a channel region of the first fin structure;

a gate electrode layer disposed over the gate dielectric layer;

sidewall spacers disposed over opposing side faces of the gate electrode layer; and an interlayer dielectric (ILD) layer disposed over the sidewall spacers, wherein:

the sidewall spacers include lower sidewall spacers and upper sidewall spacers vertically disposed on uppermost surfaces of the lower sidewall spacers, respectively, the gate dielectric layer is disposed between the sidewall spacers and the gate electrode layer, the lower sidewall spacers are made of a different insulating material than the upper sidewall spacers, the lower sidewall spacers are made of a different insulating material than the isolation insulating layer, each of the lower sidewall spacers and the upper sidewall spacers fully fill an entirety of regions between the gate dielectric layer and the ILD layer without any void, the lower sidewall spacers and the ILD layer are in direct contact with the isolation insulating layer, and the second fin structure protrudes from a dielectric layer disposed over the isolation insulating layer and made of a same material as the lower sidewall spacers and a channel height of the first fin structure is greater than a channel height of the second fin structure.

2. The semiconductor device of claim 1, wherein the lower sidewall spacers are made of a different insulating material than the ILD layer.

3. The semiconductor device of claim 2, wherein the isolation insulating layer is made of a different insulating material than the upper sidewall spacers.

4. The semiconductor device of claim 1, wherein the lower sidewall spacers are made of at least one of SiCO and SiCON.

5. The semiconductor device of claim 4, wherein:

the upper sidewall spacers are made of one of silicon nitride, SiON or SiCN, and both the lower sidewall spacers and the upper sidewall spacers are in direct contact with the gate dielectric layer.

6. A semiconductor device, comprising:

a first fin field effect transistor (FinFET); and a second FinFET, wherein:

a fin channel height of the first FinFET is greater than a fin channel height of the second FinFET, the first FinFET includes:

a first fin structure continuously protruding from a semiconductor substrate, a first channel region of the first fin structure protruding from a first isolation insulating layer provided over the substrate, and a bottom part of the first fin structure below the first channel region being embedded in the first isolation insulating layer; and a first gate dielectric layer disposed over the first channel region of the fin structure;

a first gate electrode layer disposed over the first gate dielectric layer, the second FinFET includes:

a second fin structure continuously protruding from the semiconductor substrate, a second channel region of the second fin structure protruding from a second isolation insulating layer disposed over the first isolation insulating layer, and a bottom part of the second fin structure below the second channel region being embedded in the first and second isolation insulating layers;

a second gate dielectric layer disposed over the second channel region of the fin structure; and a second gate electrode layer disposed over the second gate dielectric layer, the fin channel height of the first FinFET is measured from an interface between the first gate dielectric layer and the first isolation insulating layer, and the fin channel height of the second FinFET is measured from an interface between the second gate dielectric layer and the second isolation insulating layer.

7. The semiconductor device of claim 6, wherein:

the first FinFET further includes first sidewall spacers disposed over opposing side faces of the first gate electrode layer, the first sidewall spacers including lower sidewall spacers and upper sidewall spacers vertically disposed on uppermost surfaces of the lower sidewall spacers, respectively, the second FinFET further includes second sidewall spacers disposed over opposing side faces of the second gate electrode layer, the second sidewall spacers are made of a same material as the upper sidewall spacers, and the second isolation insulating layer is in direct contact with the second sidewall spacers.

8. The semiconductor device of claim 7, wherein:

the lower sidewall spacers are made of a different insulating material than the first isolation insulating layer, and the lower sidewall spacers are made of a same material as the second isolation insulating layer.

9. The semiconductor device of claim 8, wherein the lower sidewall spacers and the second isolation insulating layer are made of at least one of SiCO and SiCON.

10. The semiconductor device of claim 8, wherein the upper sidewall spacers and the second sidewall spacers are made at least one of SiN and SiON.

11. The semiconductor device of claim 6, wherein a top of the first fin structure and a top of the second fin structure are located at a same height.

12. The semiconductor device of claim 11, wherein a width of the first fin structure is equal to a width of the second fin structure.

13. The semiconductor device of claim 7, wherein the first gate dielectric layer is disposed between the lower and upper sidewall spacers and the first gate electrode layer.

14. The semiconductor device of claim 6, wherein:

the first FinFET further includes a first source/drain epitaxial layer disposed on a source/drain region of the first fin structure, the second FinFET further includes a second source/drain epitaxial layer disposed on a source/drain region of the second fin structure, and the second isolation insulating layer is disposed between the second source/drain epitaxial layer and the first isolation insulating layer along a vertical direction.

15. The semiconductor device of claim 14, wherein:

the first source/drain epitaxial layer is in contact with the first isolation insulating layer, and the second source/drain epitaxial layer is in contact with the second isolation insulating layer.

16. The semiconductor device of claim 15, wherein the fin channel height of the first FinFET is 1.5 to 3 times the fin channel height of the second FinFET.

17. A semiconductor static random access memory (SRAM), comprising a first pass-gate transistor, a second pass-gate transistor, a first pull-up transistor, a second pull-up transistor, a first pull-down transistor and a second pull-down transistor, each of which is formed by a fin field effect transistor (FinFET), wherein:
a first fin channel height of the FinFETs of the first and second pull-down transistors is greater than at least one of a second fin channel height of the FinFETs of the first and second pass-gate transistors and a third fin channel height of the FinFETs of the first and second pull-up transistors,
each of the FinFETs of the first and second pull-down transistors includes:
a first fin structure continuously protruding from a semiconductor substrate, a first channel region of the first fin structure protruding from a first isolation insulating layer provided over the substrate, and a bottom part of the first fin structure below the first channel region being embedded in the first isolation insulating layer; and
at least one of the FinFETs of the first and second pass-gate transistors and the FinFETs of the first and second pull-up transistors includes:
a second fin structure continuously protruding from the semiconductor substrate, a second channel region of the second fin structure protruding from a second isolation insulating layer, and a bottom part of the second fin structure below the second channel region being embedded in the second isolation insulating layer;
the first fin channel height is measured from an upper surface of the first isolation insulating layer, and
at least one of the second or third fin channel heights is measured from an upper surface of the second isolation insulating layer.

18. The semiconductor device of claim 17, further comprising:
a first isolation insulating layer and a second isolation insulating layer disposed over a part of the first isolation insulating layer, wherein:
the first and second pull-down transistors are disposed at an area where no second isolation insulating layer is disposed, and
the first and second pull-up transistors are disposed at an area where the second isolation insulating layer is disposed over the first isolation insulating layer.

19. The semiconductor device of claim 18, wherein the first and second pass-gate transistors are disposed at the area where the second isolation insulating layer is disposed over the first isolation insulating layer.

20. The semiconductor device of claim 17, wherein the second isolation insulating layer includes a bottom layer made of a same material as the first isolation insulating layer and an upper layer made of a different material than the bottom layer.

* * * * *